(12) United States Patent
Ishii

(10) Patent No.: US 11,081,581 B2
(45) Date of Patent: Aug. 3, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yuji Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 3 days.

(21) Appl. No.: 16/783,617

(22) Filed: Feb. 6, 2020

(65) Prior Publication Data

US 2020/0273990 A1 Aug. 27, 2020

(30) Foreign Application Priority Data

Feb. 21, 2019 (JP) .............................. JP2019-029393

(51) Int. Cl.
| | |
|---|---|
| *H01L 29/78* | (2006.01) |
| *H01L 29/66* | (2006.01) |
| *H01L 21/76* | (2006.01) |
| *H01L 27/092* | (2006.01) |
| *H01L 29/06* | (2006.01) |
| *H01L 29/10* | (2006.01) |

(Continued)

(52) U.S. Cl.
CPC ........ *H01L 29/7816* (2013.01); *H01L 21/761* (2013.01); *H01L 21/76224* (2013.01); *H01L 27/092* (2013.01); *H01L 29/0646* (2013.01); *H01L 29/0653* (2013.01); *H01L 29/0865* (2013.01); *H01L 29/0882* (2013.01); *H01L 29/0886* (2013.01); *H01L 29/1083* (2013.01); *H01L 29/1095* (2013.01); *H01L 29/36* (2013.01); *H01L 29/66681* (2013.01)

(58) Field of Classification Search
CPC ..... H01L 21/76; H01L 21/761; H01L 21/762; H01L 21/76224; H01L 27/092; H01L 29/78; H01L 29/7816; H01L 29/0646; H01L 29/0653; H01L 29/0865; H01L 29/0878; H01L 29/0882; H01L 29/0886; H01L 29/1083; H01L 29/1095; H01L 29/36; H01L 29/66; H01L 29/66681; H01L 29/66689
USPC ...................................................... 257/343
See application file for complete search history.

(56) References Cited

U.S. PATENT DOCUMENTS

2014/0070311 A1* 3/2014 Yang ................ H01L 29/66689
257/335
2019/0067470 A1* 2/2019 Fujii ................... H01L 29/7834

OTHER PUBLICATIONS

Mun Nam Chil et al., "Advanced 300mm 130nm BCD technology from 5V to 85V with Deep-Trench Isolation", Proceedings of the 2016 28th International Symposium on Power Semiconductor Devices and ICs (ISPSD), Jun. 12-16, 2016, pp. 403-406.

* cited by examiner

*Primary Examiner* — Fazli Erdem
(74) *Attorney, Agent, or Firm* — McDermott Will & Emery LLP

(57) ABSTRACT

The n-type body extension region BER is separated from the n⁺ buried region BL by the p-type impurity region PIR and is in contact with the p-type drift region DFT1. At the end of the n-type body extension region BER closest to the p⁺ drain region DC, the first portion FP of the n-type body extension region BER located closest to the second surface SS is located closer to the p⁺ drain region DC than the second portion SP of the n-type body extension region BER (Continued)

located at the first surface FS, and is located closer to the second surface SS than the bottom surface BS of the element isolation insulating film SIS.

10 Claims, 25 Drawing Sheets

(51) Int. Cl.
*H01L 29/08* (2006.01)
*H01L 21/761* (2006.01)
*H01L 21/762* (2006.01)
*H01L 29/36* (2006.01)

SEMICONDUCTOR DEVICE AND METHOD OF MANUFACTURING THE SAME

CROSS-REFERENCE TO RELATED APPLICATIONS

The disclosure of Japanese Patent Application No. 2019-029393 filed on Feb. 21, 2019 including the specification, drawings and abstract is incorporated herein by reference in its entirety.

BACKGROUND

The disclosed embodiments relate to a semiconductor device and a method of manufacturing the same, for example, it can be suitably applied to a semiconductor device and a method of manufacturing having BiC-DMOS (Bipolar Complementary Metal Oxide Semiconductor).

BiC-DMOS is mixed LDMOS (Laterally Diffused Metal Oxide Semiconductor) transistor and CMOS (Complementary Metal Oxide Semiconductor) transistor. BiC-DMOS is used in automobiles, motor drives, audio amplifiers, and the like. For example, LDMOS transistors of BiC-DMOS used for monitoring batteries in vehicle are required to be high breakdown voltage.

Such LDMOS transistors are described in, for example, Mun Nam Chil et al., "Advanced 300 mm 130 nm BCD technology from 5 V to 85 V with Deep-Trench Isolation", ISPSD2016, pp. 403-406, 2016 (Non-patent Document 1). In this document, a back gate structure of the LDMOS transistor has an n-type buried region (NBL), an n-type epitaxial layer (N-EPI) connected to the n-type buried region (NBL), and an n-type body region (N-Body) connected to the n-type epitaxial layer (N-EPI).

SUMMARY

In the above Non-patent Document 1, the n-type body region (N-Body) to be the back gate has substantially same potential as the n-type buried region (NBL). Therefore, the breakdown voltage in a depth direction between the drain region and the n-type buried region (NBL) cannot be increased.

Other objects and novel features will become apparent from the description of this specification and the accompanying drawings.

According to embodiments, a body extension region of a first conductivity type is separated from a buried region of the first conductivity type by an isolation region of a second conductivity type and is in contact with a drift region. At an end potion of the body extension region on the drain region side, a first portion of the body extension region located closest to a second surface is located closer to the drain region than a second portion of the body extension region located on a first surface, and is located closer to the second surface than a bottom surface of an element isolation insulating film.

According to the above-mentioned embodiments, it is possible to realize a semiconductor device and a method of manufacturing the same capable of increasing the breakdown voltage in the depth direction is provided.

DETAILED DESCRIPTION

Figure 1:
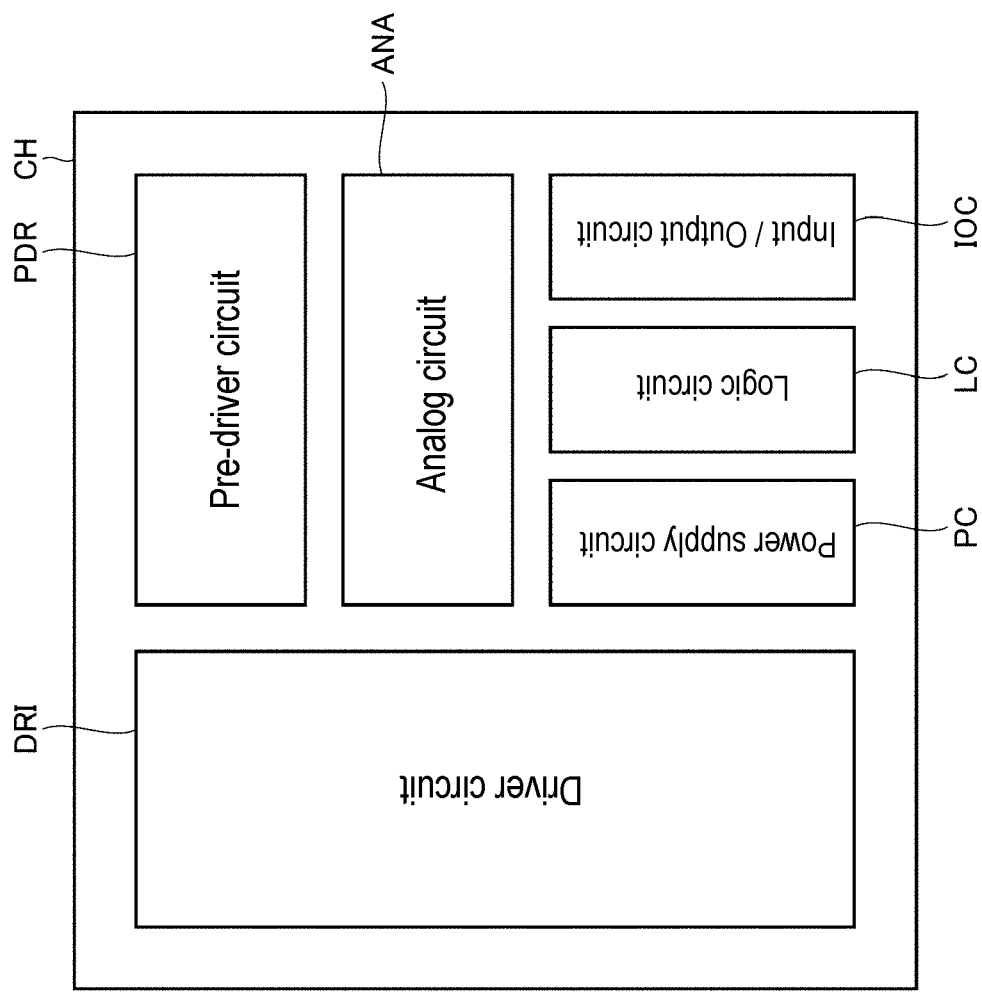
FIG. 1 is a plan view schematically showing a configuration of a semiconductor device in a chip state in a first embodiment.

Hereinafter, embodiments of the present disclosure will be described in detail with reference to the drawings. In the specification and drawings, the same or corresponding components are denoted by the same reference numerals, and a repetitive description thereof is not repeated. In the drawings, for convenience of description, the configuration may be omitted or simplified. Further, at least a part of each embodiment and each modification may be arbitrarily combined with each other.

First Embodiment

Overall Structure in a Plan View of a Semiconductor Device

First, an overall structure of the semiconductor device will be described with reference to FIG. 1.

As shown in FIG. 1, a semiconductor device CH of the present embodiment is, for example, a chip-state and having a semiconductor substrate. On a front surface of the semiconductor substrate, formation regions such as a driver circuit DRI, a pre-driver circuit PDR, an analog circuit ANA, a power supply circuit PC, a logic circuit LC, and an input/output circuit IOC are disposed. The semiconductor device CH in the present embodiment is used, for example, in automobiles, motor drives, audio amplifiers, and the like.

The semiconductor device of the present embodiment is not limited to the semiconductor chip, and may be in a wafer state, or may be in a packaged state in which the semiconductor chip is sealed with a sealing resin.

Structure of a pLDMOS Transistor

Next, a p-channel LDMOS (pLDMOS) transistor LPT is exemplified as an insulated-gate field-effect transistor included in the semiconductor device in the present embodiment, and its configuration will be described with reference to FIGS. 2 to 6. In the following, a plan view means a viewpoint viewed from a direction perpendicular to a first surface FS of a semiconductor substrate SUB.

Figure 3:
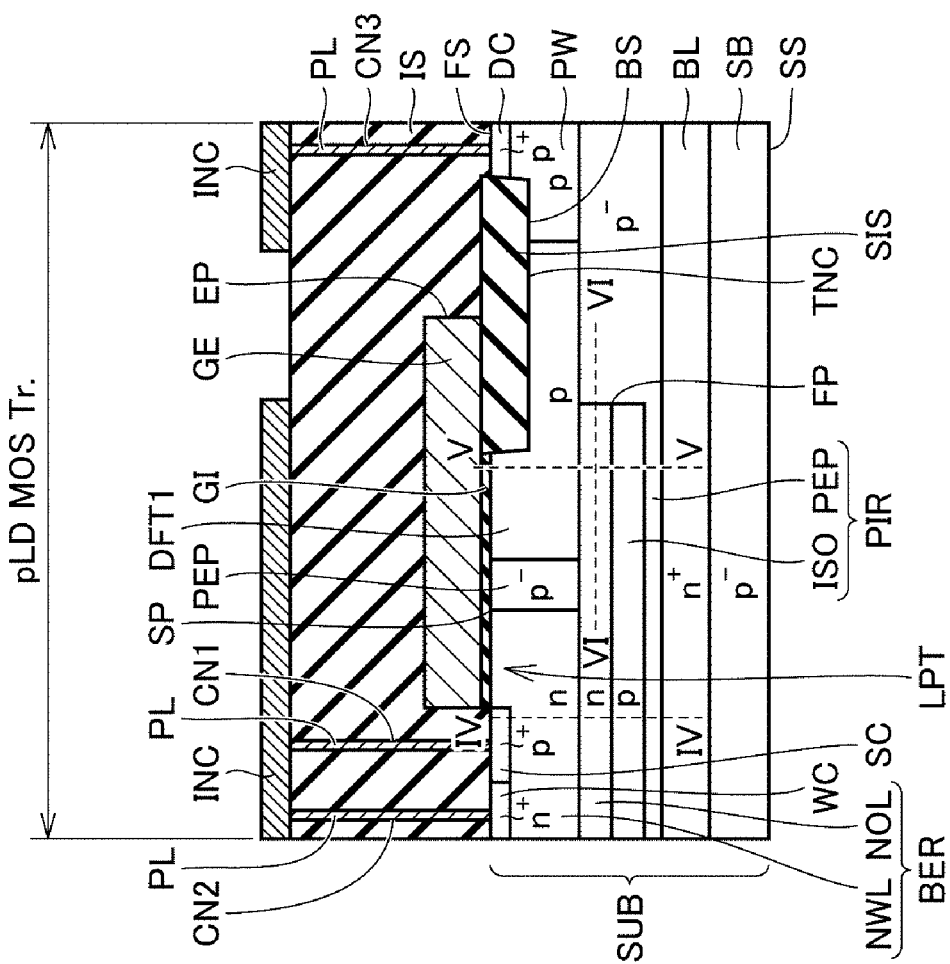
FIG. 3 is a schematic cross-sectional view along the III-III line of FIG. 2.

As shown in FIG. 3, the semiconductor substrate SUB has the first surface FS and a second surface SS facing each other. In a formation region of the pLDMOS transistor LPT, the semiconductor device CH has a p$^-$ substrate region SB, a n$^+$ buried region BL (buried region), a p-type impurity region PIR (isolation region), and an n-type body extension region BER. And in the formation region of the pLDMOS transistor LPT, the semiconductor device CH has an element isolation insulating film SIS of STI (Shallow Trench Isolation), a p-type drift region DFT1, and a p-type well region PW.

A p$^-$ substrate region SB is disposed on the second surface SS of the semiconductor substrate SUB. The n$^+$ buried region BL is disposed on the first surface FS of the p$^-$ substrate region SB. The n$^+$ buried region BL is disposed away from the second surface SS. The n$^+$ buried region BL has a floating potential. The n$^+$ buried region BL constitutes a p-n junction with the p$^-$ substrate region SB.

The p-type impurity region PIR is disposed on the first surface FS side of the n$^+$ buried region BL. The p-type impurity region PIR constitutes a p-n junction with the n$^+$ buried region BL. The p-type impurity region PIR has a p$^-$ epitaxial region PEP (epitaxial region) and a p-type punch-through prevention layer ISO (high density region).

The p$^-$ epitaxial region PEP constitutes a p-n junction with the n$^+$ buried region BL. The p-type punch-through prevention layer ISO have higher p-type impurity density than the p$^-$ epitaxial region PEP. The p-type punch-through prevention layer ISO sandwiches a part of the p$^-$ epitaxial region PEP between the n$^+$ buried region BL.

The n-type body extension region BER is disposed on the first surface FS side of the p-type impurity region PIR. The n-type body extension region BER is electrically isolated from the n$^+$ buried region BL by the p-type impurity region PIR. The p-type punch-through prevention layer ISO is disposed on a second surface SS side of the n-type body extension region BER.

The n-type body extension region BER has an n-type body region NWL and an n-type extension region NOL. The n-type extension region NOL constitutes a p-n junction with the p-type impurity region PIR. More specifically, an entire portion of the n-type extension region NOL on the second surface SS side constitutes a p-n junction with the p-type punch-through prevention layer ISO, and the side portion of the n-type extension region NOL constitutes a p-n junction with the p$^-$ epitaxial region PEP.

The n-type body region NWL is formed on a first surface FS side of the n-type extension region NOL. The n-type body region NWL is in contact with the n-type extension region NOL.

A p$^+$ source region SC and a n$^+$ contact region WC are disposed on the first surface FS in the n-type body region NWL. The p$^+$ source region SC and the n$^+$ contact region WC are adjacent to each other. The p$^+$ source region SC constitutes a p-n junction with each of the n-type body extension region BER and the n$^+$ contact region WC. The n$^+$ contact region WC has an n-type impurity density higher than the n-type impurity density of the n-type body region NWL.

Each of the p-type drift region DFT1 and the p-type well region PW is disposed on the first surface FS side of the p-type impurity region PIR. The p-type drift region DFT1 is disposed so as to adjacent to the p-type well region PW.

An entire portion of the p-type well region PW on a second surface SS side is in contact with the p$^-$ epitaxial region PEP of the p-type impurity region PIR. The p-type well region PW has a p-type impurity density higher than a p-type impurity density of the p$^-$ epitaxial region PEP. The p$^+$ drain region DC is disposed on the first surface FS in the p-type well region PW.

The p$^+$ drain region DC has a p-type impurity density higher than a p-type impurity density of the p-type well region PW. The p$^+$ drain region DC is spaced apart from the p$^+$ source region SC.

A portion of the p-type drift region DFT1 on the second surface SS side is in contact with the p$^-$ epitaxial region PEP of the p-type impurity region PIR. Another part of the p-type drift region DFT1 on the second surface SS side constitutes a p-n junction with the n-type extension region NOL of the n-type body extension region BER. The p-type drift region DFT1 has a p-type impurity density higher than a p-type impurity density of the p$^-$ epitaxial region PEP.

The p$^-$ epitaxial region PEP is disposed between the p-type drift region DFT1 and the n-type body region NWL of the n-type body extension region BER. One side of the p$^-$ epitaxial region PEP is in contact with the p-type drift region DFT1. The other side of the p$^-$ epitaxial region PEP constitutes a p-n junction with the n-type body region NWL. An entire portion of the p⁻ epitaxial region PEP on the second surface SS side constitutes a p-n junction with the n-type extension region NOL.

The p⁻ epitaxial region PEP may not be disposed between the p-type drift region DFT1 and the n-type body region NWL. In this case, the p-type drift region DFT1 and the n-type body region NWL are in contact with each other to constitute a p-n junction.

In the formation region of the pLDMOS transistor LPT, STI is selectively disposed on the first surface FS of the semiconductor device CH. The STI has an isolation trench TNC and the element isolation insulating film SIS.

The isolation trench TNC of the STI is disposed between the p⁺ source region SC and the p⁺ drain region DC. The p⁺ drain region DC is adjacent to the isolation trench TNC. The p-type drift region DFT1, the p⁻ epitaxial region PEP and the n-type body region NWL are disposed on the first surface FS between the p⁺ source region SC and the isolation trench TNC.

The element isolation insulating film SIS is buried in the isolation trench TNC. The element isolation insulating film SIS has a bottom surface BS located on the first surface FS of the semiconductor substrate SUB and closer to the second surface SS than the first surface FS. The element isolation insulating film SIS is sandwiched between the p⁺ source region SC and the p⁺ drain region DC.

A gate electrode GE is disposed on a region of the semiconductor substrate SUB sandwiched between the p⁺ source region SC and the p⁺ drain region DC. The gate electrode GE is disposed on the first surface FS sandwiched between the p⁺ source region SC and the element isolation insulating film SIS with a gate dielectric film GI interposed therebetween. The gate electrode GE is opposed while being insulated from each of the p-type drift region DFT1, the p⁻ epitaxial region PEP and the n-type body region NWL.

The gate electrode GE runs on the element isolation insulating film SIS of the STI. The gate electrode GE is opposed the p-type drift region DFT1 with the element isolation insulating film SIS of the gate electrode GE interposed therebetween.

The pLDMOS transistor LPT has the p⁺ source region SC, the p⁺ drain region DC, and the gate electrode GE.

An interlayer insulating film IS is disposed on the first surface FS of the semiconductor substrate SUB so as to cover the pLDMOS transistor LPT. Contact holes CN1, CN2, CN3 are formed in the interlayer insulating film IS that reach the p⁺ source region SC, the n⁺ contact region WC, and the p⁺ drain region DC, respectively. In each of the contact holes CN1, CN2, CN3, a plug conductive layer PL is buried. On the interlayer insulating film IS, a wiring layer INC is disposed so as to be in contact with the plug conductive layer PL. As a result, the wiring layer INC is electrically connected to the respective impurity region with the plug conductive layer PL interposed therebetween.

In the present embodiment, at an end of the n-type body extension region BER on the p⁺ drain region DC, the n-type body extension region BER has a first portion FP located closest to the second surface SS and a second portion SP located on the first surface FS. The first portion FP is located closer to the p⁺ drain region DC than the second portion SP and is located closer to the second surface SS than the bottom surface BS of the element isolation insulating film SIS.

The first portion FP is the end portion of the n-type extension region NOL closest to a p⁺ drain region DC side, and is a portion of the n-type extension region NOL closest to the second surface SS. The second portion SP is an end of the n-type body region NWL closer to the p⁺ drain region DC and in contact with the first surface FS.

The n-type extension region NOL protrudes from the n-type body region NWL toward the p⁺ drain region DC. The n-type extension region NOL extends from the n-type body region NWL to the second surface SS side of the element isolation insulating film SIS. That is, the n-type extension region NOL extends to the p⁺ drain region DC side from an end of the element isolation insulating film SIS on the p⁺ source region SC side.

The end of the n-type extension region NOL on the p⁺ drain region DC side (First end: an end where the first portion FP is located) is located closer to the p⁺ source region SC than an end potion EP (Second end) of the gate electrode GE in a p⁺ drain region DC side.

Figure 2:
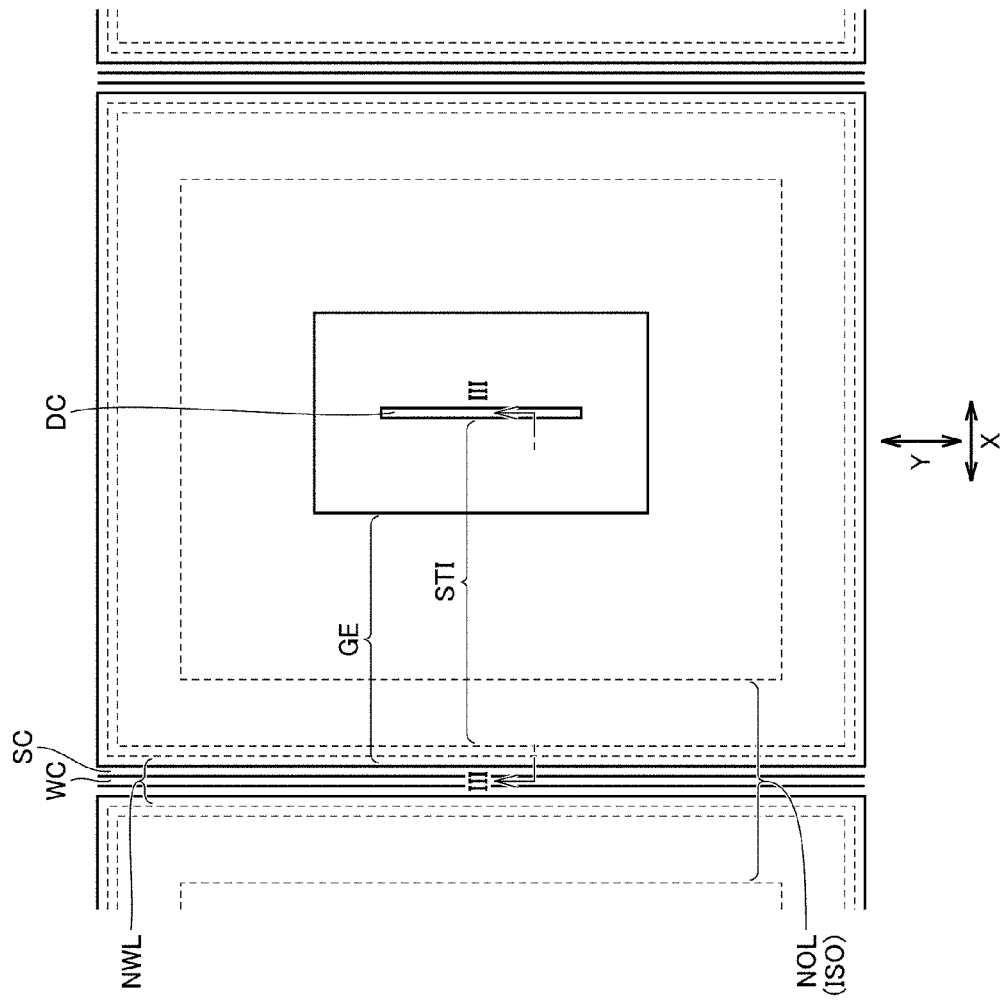
FIG. 2 is a plan view showing a configuration of a pLDMOS transistor of the semiconductor device shown in FIG. 1.

As shown in FIG. 2, in plan view, the gate electrode GE and STI are disposed so as to surround the p⁺ drain region DC. In plan view, the n-type body extension region BER and the p-type punch-through prevention layer ISO are disposed so as to surround the p⁺ drain region DC.

In plan view, the p⁺ source region SC extends along a direction (e.g., a perpendicular direction (Y-direction)) crossing a direction (X-direction) from the p⁺ drain region DC toward the p⁺ source region SC. In plan view, the p⁺ source region SC extends longer than the p⁺ drain region DC in the intersecting direction Y. In plan view, the p-type punch-through prevention layer ISO extends longer than the p⁺ drain region DC in the intersecting direction (Y-direction).

The p⁺ source region SC may be disposed so as to surround the periphery of the p⁺ drain region DC in plan view.

Impurity Density Distribution

Next, an impurity density distribution in the depth direction of the n-type extension region NOL and the p-type punch-through prevention layer ISO, that is, in the direction from the first surface FS to the second surface SS, will be described with reference to FIGS. 4 and 5. The impurity density distributions of the n-type extension region NOL and the p⁻ epitaxial region PEP in the lateral direction along the first surface FS will be described with reference to FIG. 6.

Figure 4:
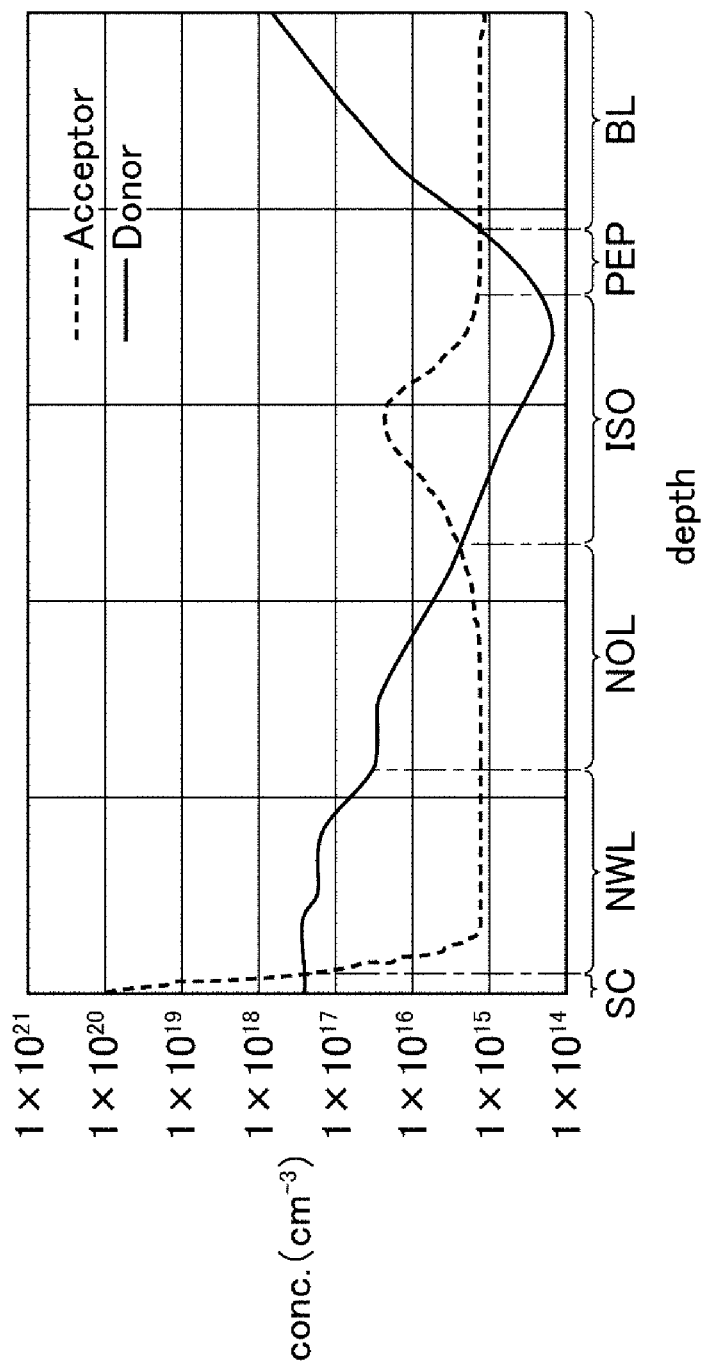
FIG. 4 is a diagram showing impurity density distributions of portion along the IV-IV line in FIG. 3.
Figure 5:
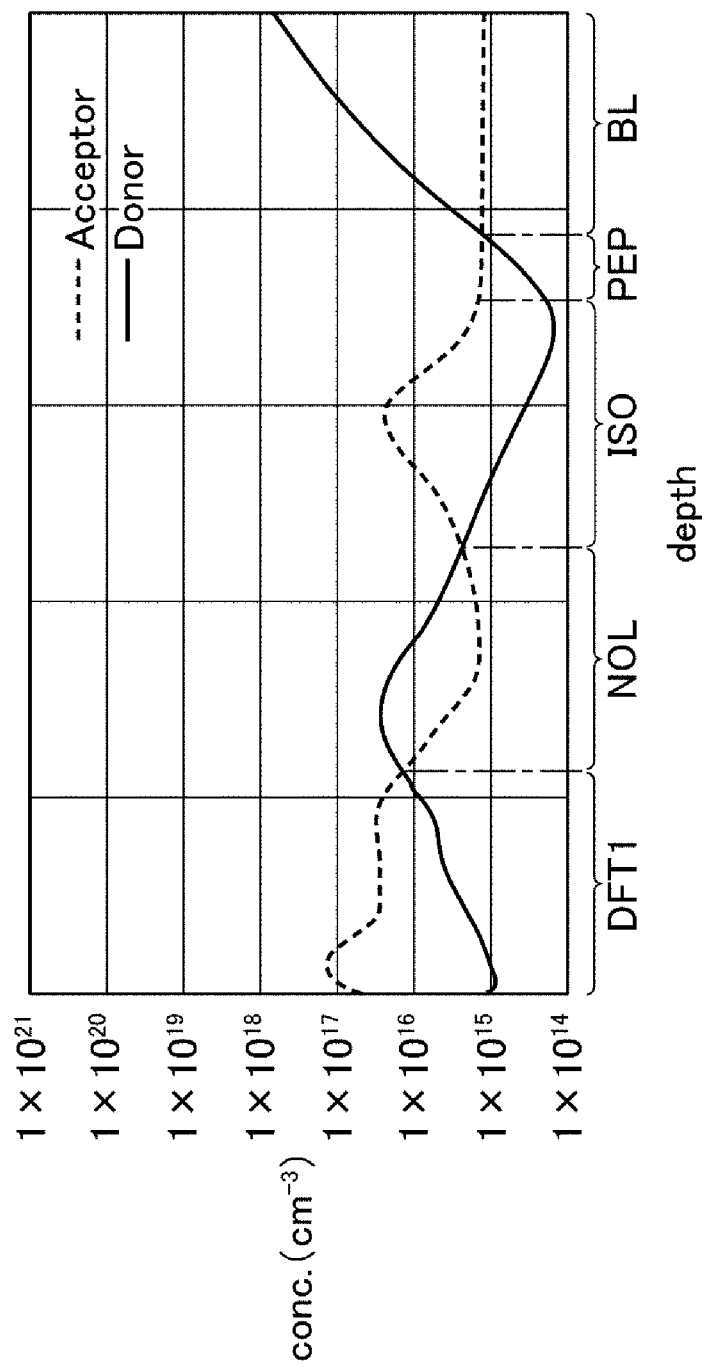
FIG. 5 is a diagram showing impurity density distributions of portion along the V-V line in FIG. 3.
Figure 6:
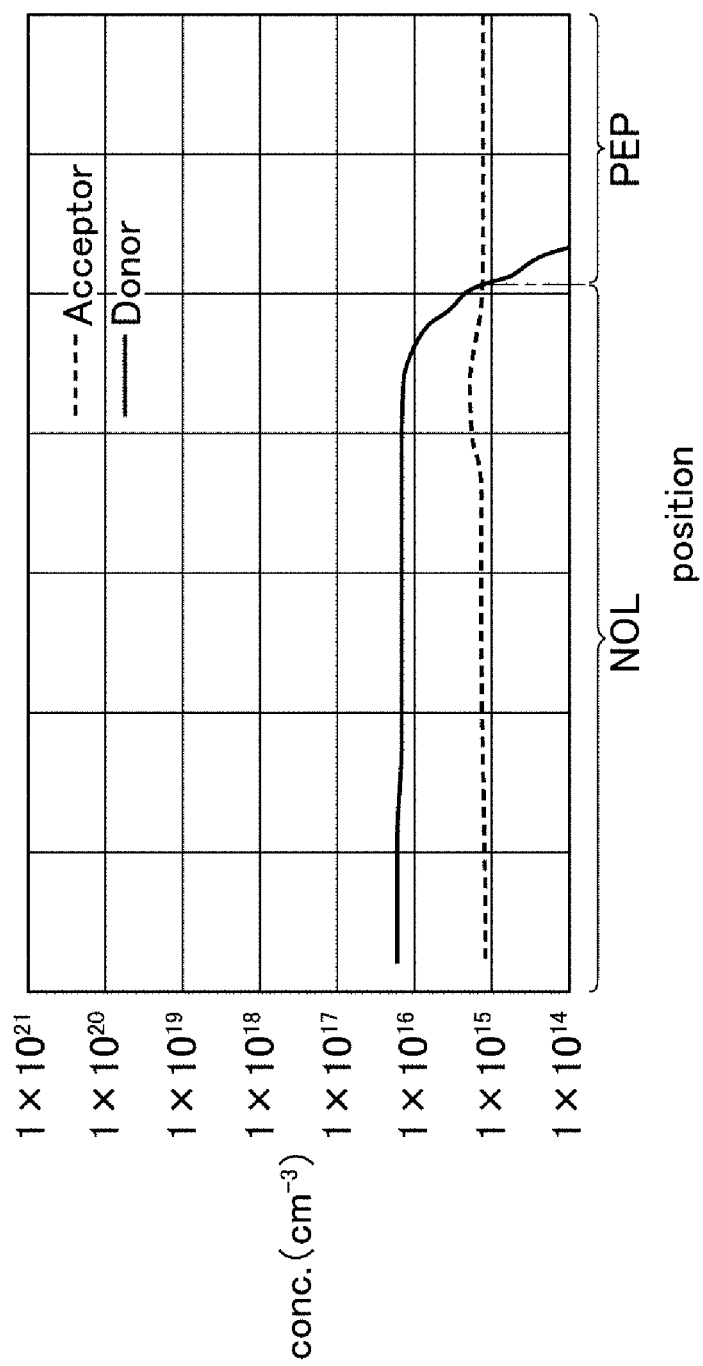
FIG. 6 is a diagram showing impurity density distributions of portion along the VI-VI line in FIG. 3.

As shown in FIGS. 4 to 6, The donor (n-type impurities) in the n-type extension region NOL has peak density of $1\times10^{16}$ cm$^{-3}$~$1\times10^{17}$ cm$^{-3}$. The acceptor (p-type impurities) in the p-type punch-through prevention layer ISO has peak density of $1\times10^{16}$ cm$^{-3}$ $1\times10^{17}$ cm$^{-3}$.

Donor in the n-type body region NWL has a higher peak density than donor in the n-type extension region NOL and has a peak density of $1\times10^{17}$ cm$^3$ $1\times10^{18}$ cm$^{-3}$. Acceptor of the p⁻ epitaxial region PEP has a lower density than acceptor of the p-type punch-through prevention layer ISO and a density of $1\times10^{15}$ cm$^{-3}$ $1\times10^{16}$ cm$^{-3}$.

The n-type extension region NOL is preferably located at a depth of, for example, about 1 μm-2 μm from the first surface FS of the semiconductor substrate SUB. And a thickness of the n-type extension region NOL in the depth direction is preferably, for example, 1 μm or less.

Note that the density, depth, and thickness of the n-type extension region NOL affect HCI (Hot Carrier Injection) characteristics, on-resistance, and off-breakdown voltage, which will be described later. Therefore, the density, the depth, and the thickness of the n-type extension region NOL need to be appropriately set in consideration of the above mentioned respective characteristics.

Manufacturing Method of the Semiconductor Device

Next, a manufacturing method of the semiconductor device of the present embodiment will be described with reference to FIGS. 7 to 15. FIGS. 7 to 15 show cross-sections corresponding to those of FIG. 3.

Figure 7:
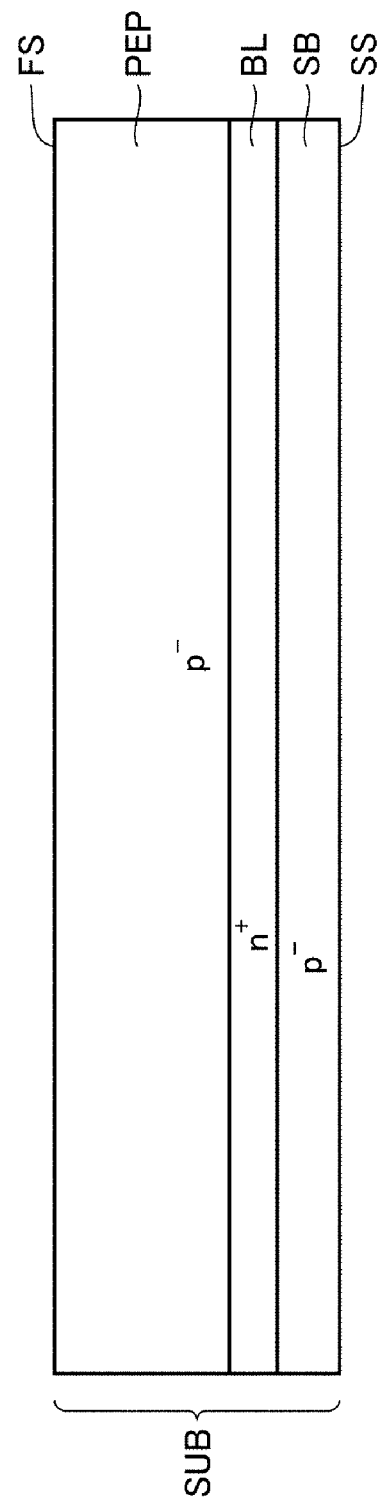
FIG. 7 is a schematic cross-sectional view showing a first step of a manufacturing method of the semiconductor device in the first embodiment.

As shown in FIG. 7, in the formation region of the pLDMOS transistor LPT, the n+ buried region BL is formed on the first surface FS of the p− substrate region SB by, for example, ion implantation. The p− epitaxial region PEP is formed on the first surface FS of the n+ buried region BL by epitaxial growth such that the p− epitaxial region PEP has a thickness of, for example, several μm. The p− epitaxial region PEP is formed to constitute a p-n junction with the n+ buried region BL. And the n+ buried region BL are formed to have a floating potential.

As a result, the semiconductor substrate SUB having the first surface FS and the second surface SS facing each other and having the n+ buried region BL having the floating potential in the formation region of the pLDMOS transistor is prepared.

Figure 8:
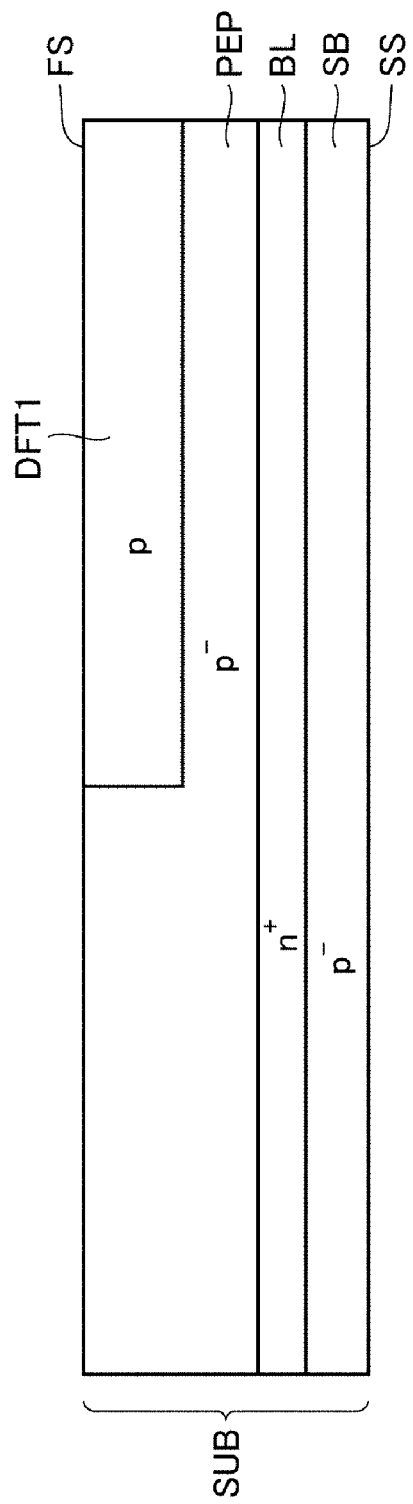
FIG. 8 is a schematic cross-sectional view showing a second step of the manufacturing method of the semiconductor device in the first embodiment.

As shown in FIG. 8, a photoresist pattern (not shown) is formed on the first surface FS of the semiconductor substrate SUB by a conventional photolithography technique. Using the photoresist pattern as a mask, p-type impurity ions are implanted into the first surface FS of the semiconductor substrate SUB. Thereafter, a heat treatment is performed at a temperature of about 900~1000° C. to diffuse the ion implantation p-type impurity. As a result, the p-type drift region DFT1 is formed on the first surface FS in the p− epitaxial region PEP.

The p-type drift region DFT1 is formed to have a p-type impurity density higher than a p-type impurity density of the p− epitaxial region PEP. Thereafter, the photoresist pattern is removed by, for example, ashing.

Figure 9:
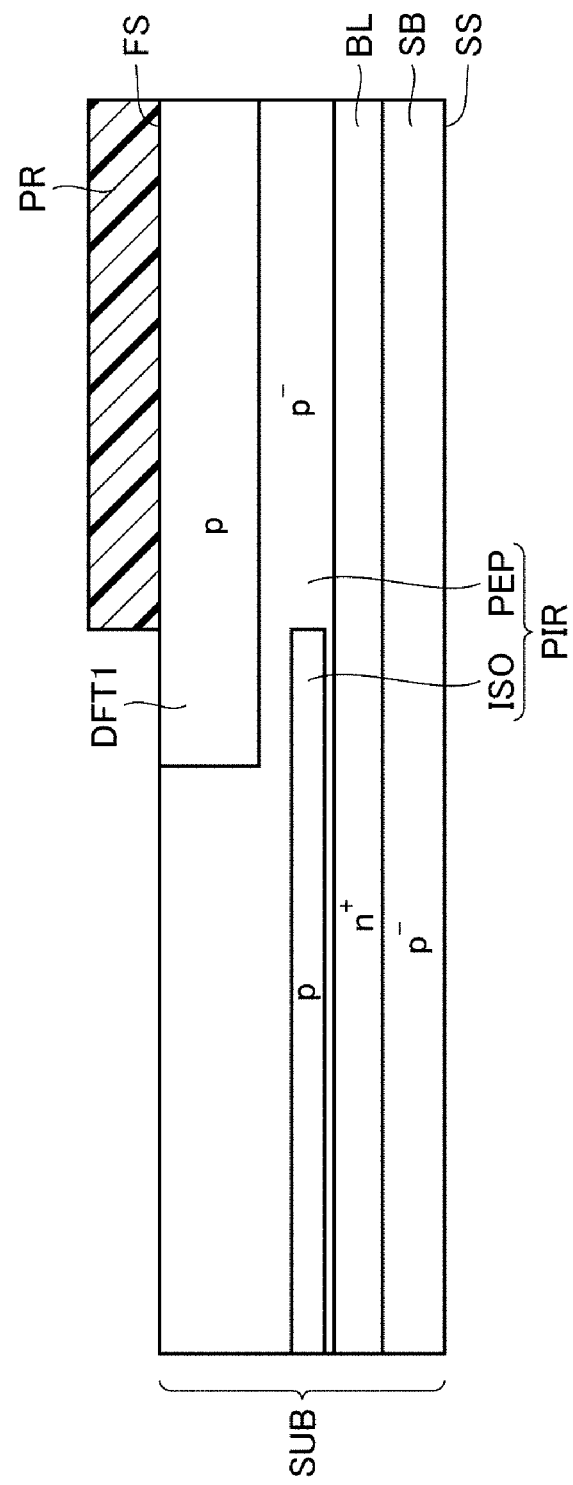
FIG. 9 is a schematic cross-sectional view showing a third step of the manufacturing method of the semiconductor device in the first embodiment.

As shown in FIG. 9, a photoresist pattern PR is formed on the first surface FS of the semiconductor substrate SUB by a normal photolithography technique. Using the photoresist pattern PR as a mask, p-type impurities for forming the p-type punch-through prevention layer ISO are ion-implanted into the p− epitaxial region PEP of the semiconductor substrate SUB.

Figure 10:
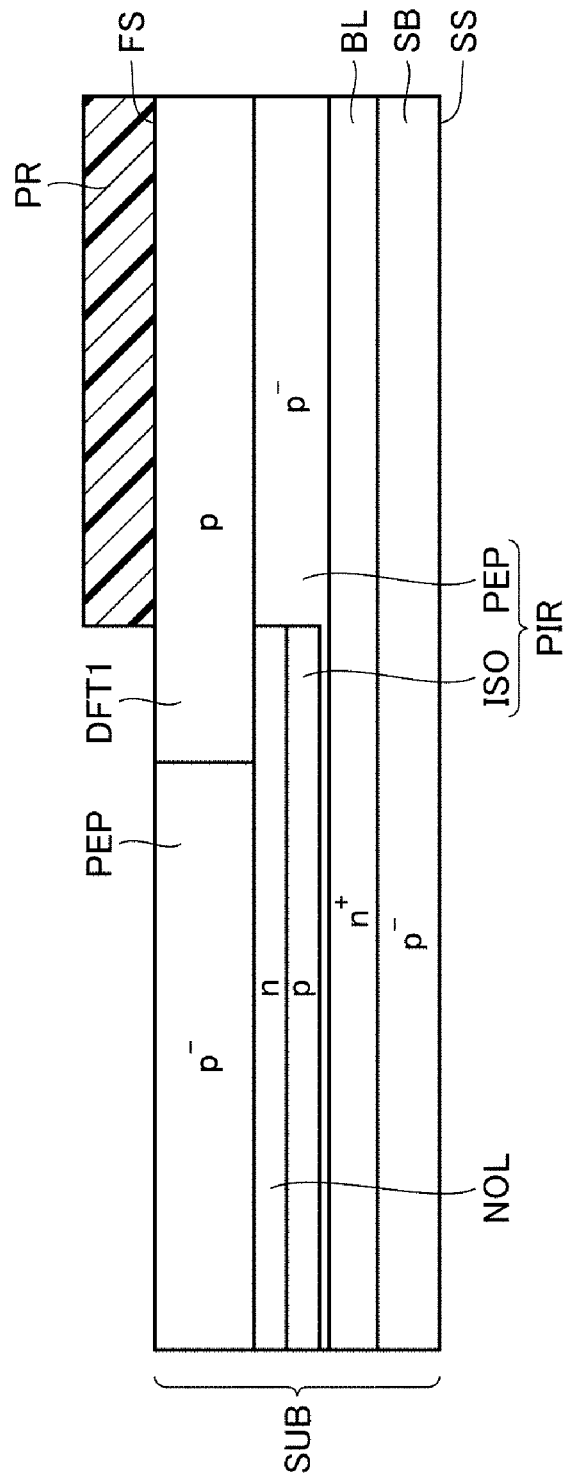
FIG. 10 is a schematic cross-sectional view showing a fourth step of the manufacturing method of the semiconductor device in the first embodiment.

As shown in FIG. 10, n-type impurities for forming n-type extension region NOL is ion-implanted into the p− epitaxial region PEP of the semiconductor substrate SUB using the photoresist pattern PR as a mask.

Thereafter, a heat treatment for diffusing the implanted p-type impurity and n-type impurity is performed to form the p-type punch-through prevention layer ISO and the n-type extension region NOL. The p-type punch-through prevention layer ISO and the n-type extension region NOL are formed so as to overlap each other in plan view. The p− epitaxial region PEP and the p-type punch-through prevention layer ISO constitute the p-type impurity region PIR. The p-type impurity region PIR is formed on the first surface FS of the n+ buried region BL.

Since the p-type punch-through prevention layer ISO and the n-type extension region NOL are formed using the same photoresist pattern PR as a mask by chain implantation or the like, an individual photomask becomes unnecessary.

Figure 11:
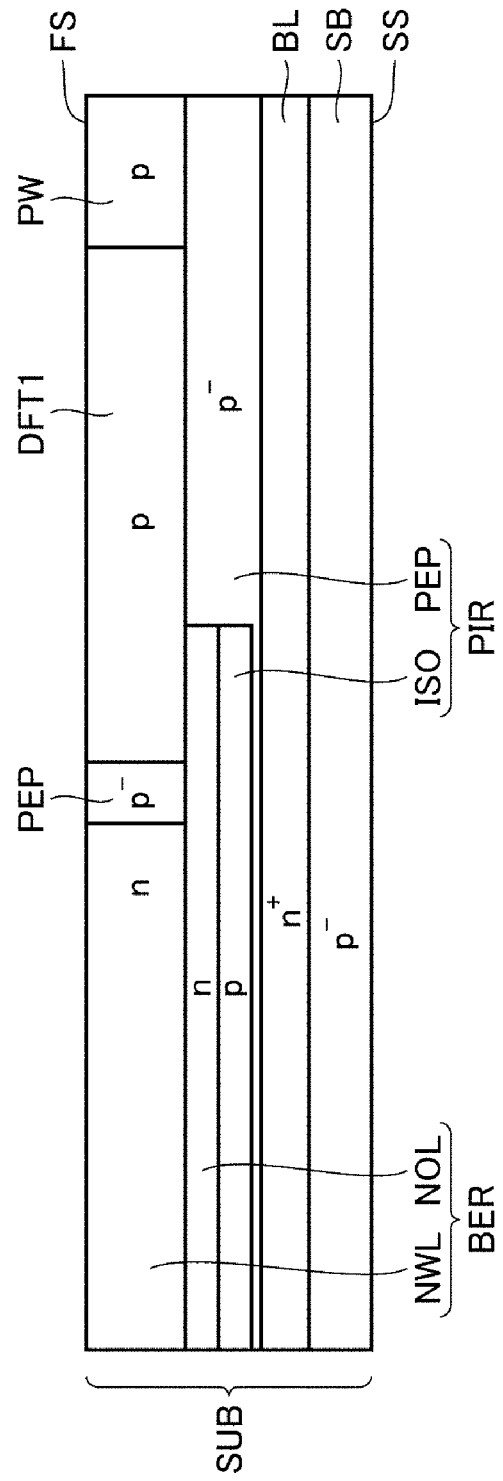
FIG. 11 is a schematic cross-sectional view showing a fifth step of the manufacturing method of the semiconductor device in the first embodiment.

Thereafter, the photoresist pattern PR is removed by, for example, ashing. As shown in FIG. 11, n-type impurity ions are selectively implanted into the first surface FS of the semiconductor substrate SUB. As a result, the n-type body region NWL is formed on the first surface FS of the semiconductor substrate SUB. The n-type body region NWL is located on a first surface FS side of the n-type extension region NOL and is formed so as to be in contact with the n-type extension region NOL.

The n-type body region NWL and the n-type extension region NOL constitute the n-type body extension region BER. The n-type body extension region BER is formed so as to be electrically isolated from the n+ buried region BL by the p-type impurity region PIR.

In addition, p-type impurity ions are selectively implanted into the first surface FS of the semiconductor substrate SUB. As a result, the p-type well region PW is formed on the first surface FS of the semiconductor substrate SUB.

Figure 12:
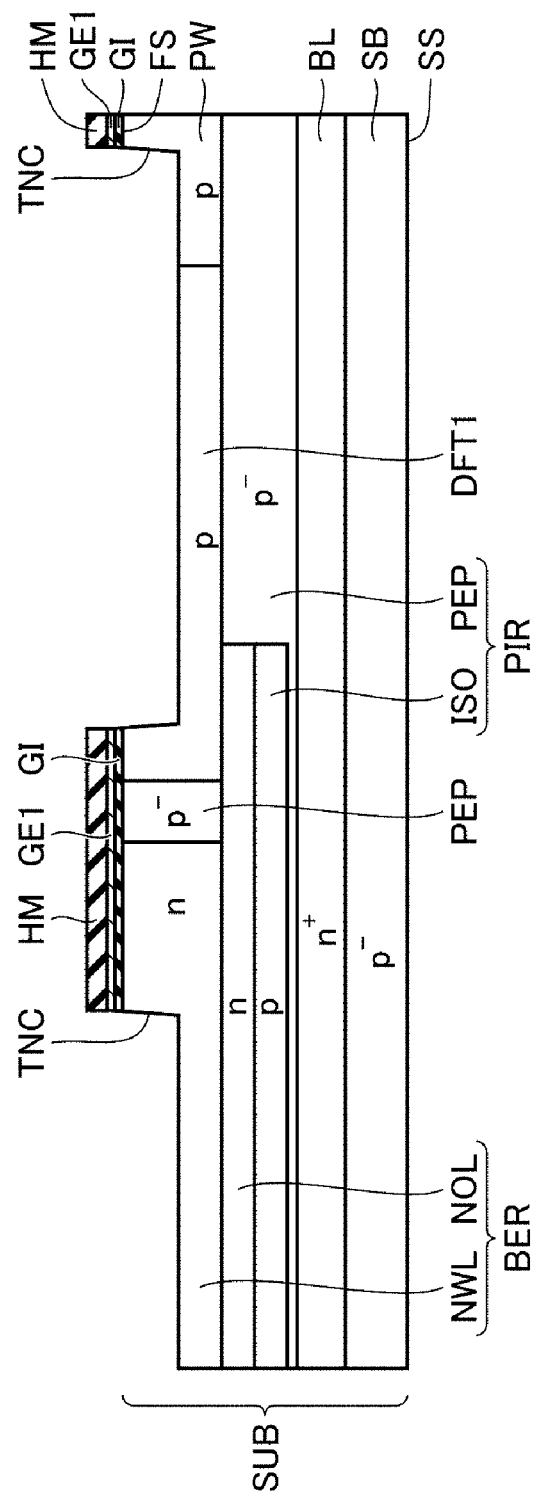
FIG. 12 is a schematic cross-sectional view showing a sixth step of the manufacturing method of the semiconductor device in the first embodiment.

As shown in FIG. 12, the gate dielectric film GI made of, for example, a silicon oxide film is formed on the first surface FS of the semiconductor substrate SUB. The gate dielectric film GI is formed with a film thickness of, for example, several μm to several tens of μm. On the gate dielectric film GI, a conductive film GE1 made of, for example, polycrystalline silicon doped with impurities (doped polysilicon) is formed. On the conductive film GE1, a hard mask layer HM made of, for example, a silicon nitride film is formed. Each of the conductive film GE1 and the hard mask layer HM is formed to a thickness of several tens of nanometers, for example.

Thereafter, the hard mask layer HM is patterned by conventional photolithography and etching techniques. Using the patterned hard mask layer HM as a mask, the conductive film GE1, the gate dielectric film GI and semiconductor substrate SUB are etched. The etching forms the isolation trench TNC of the STI on the first surface FS of the semiconductor substrate SUB. The isolation trench TNC is formed shallower than the n-type body region NWL, the p-type drift region DFT1, and the p-type well region PW. The isolation trench TNC is formed to have a depth of, for example, several hundred μm from the first surface FS of the semiconductor substrate SUB.

Figure 13:
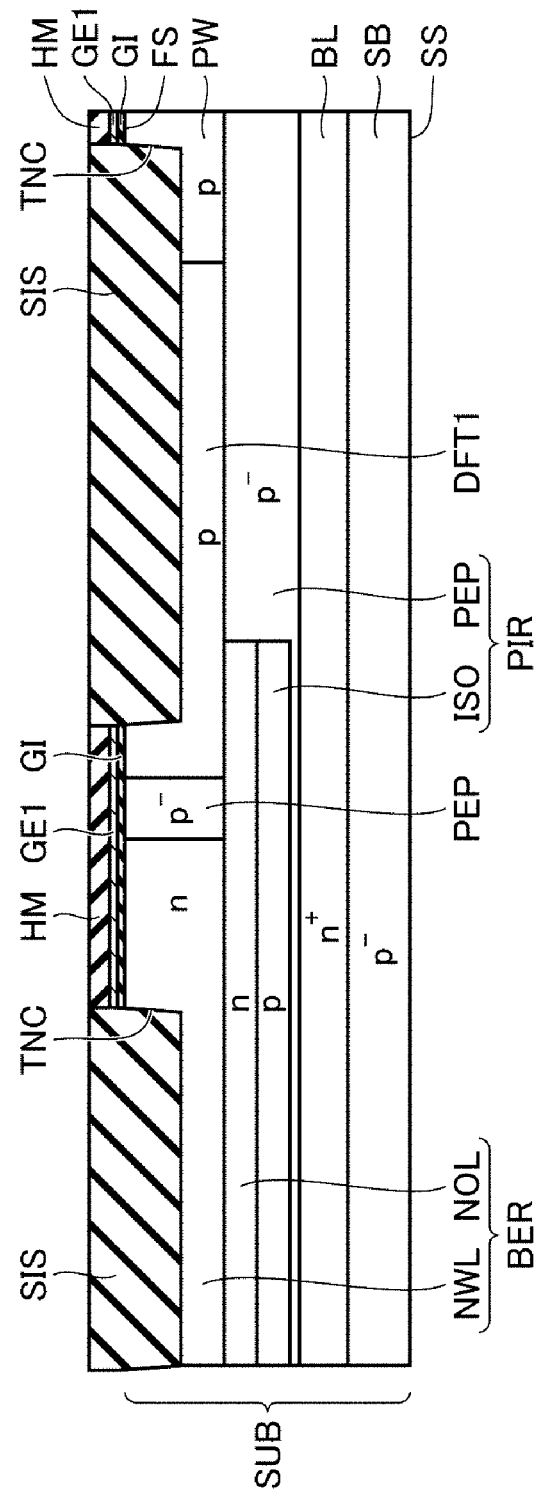
FIG. 13 is a schematic cross-sectional view showing a seventh step of the manufacturing method of the semiconductor device in the first embodiment.

As shown in FIG. 13, the element isolation insulating film SIS made of, for example, a silicon oxide film is formed so as to bury the isolation trench TNC. In forming the element isolation insulating film SIS, for example, the element isolation insulating film SIS is formed on an entire first surface FS of the semiconductor substrate SUB so as to bury the inside of the isolation trench TNC. Thereafter, the element isolation insulating film SIS is polished by, for example, CMP (Chemical Mechanical Polishing) until the surface of the hard mask layer HM is exposed. As a result, the element isolation insulating film SIS remains only in the isolation trench TNC. The element isolation insulating film SIS is formed to have the bottom surface BS located on the first surface FS of the semiconductor substrate SUB and closer to the second surface SS than the first surface FS.

As described above, the STI including the isolation trench TNC and the element isolation insulating film SIS are formed. Thereafter, the hard mask layer HM is removed by, for example, etching.

Figure 14:
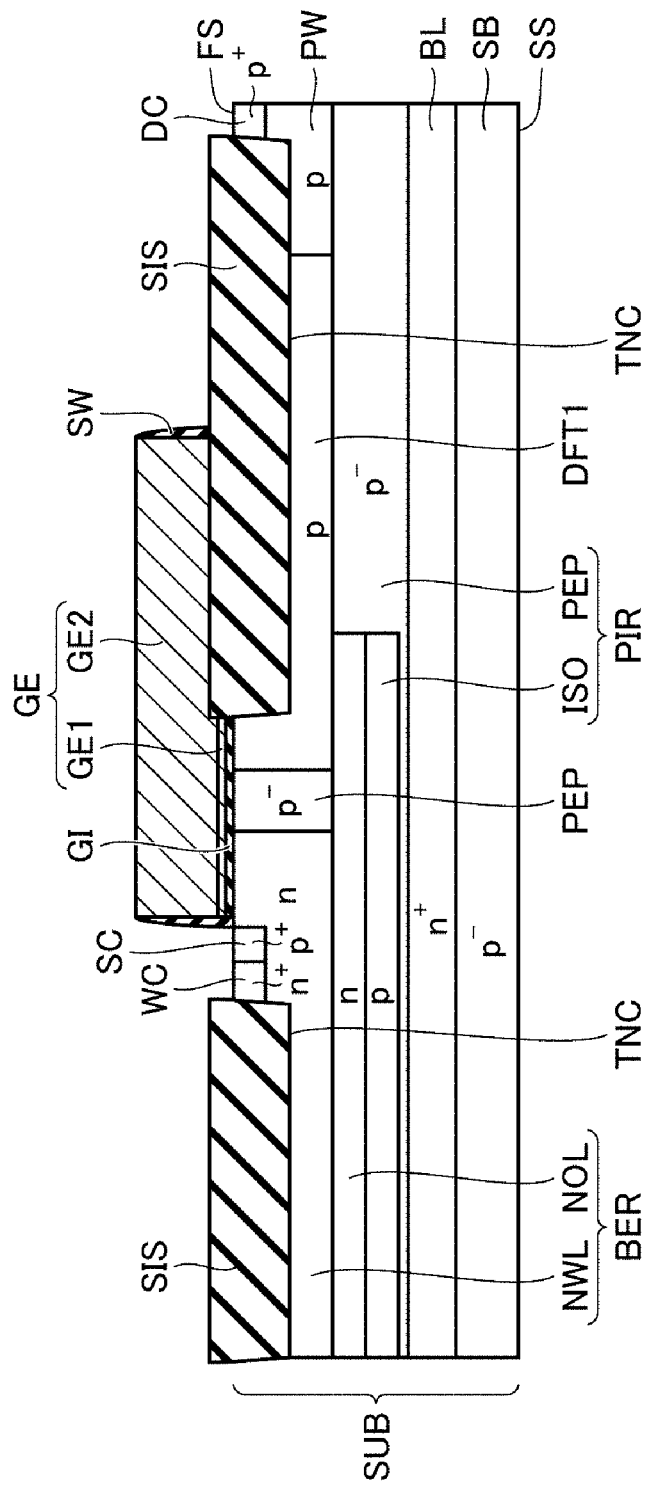
FIG. 14 is a schematic cross-sectional view showing an eighth step of the manufacturing method of the semiconductor device in the first embodiment.

As shown in FIG. 14, a conductive film GE2 made of, for example, doped polysilicon is formed on an entire surface of the first surface FS of the semiconductor substrate SUB. The conductive film GE2 is formed to a thickness of several tens of nm, for example. Thereafter, the conductive films GE1 and GE2 are patterned by conventional photolithography and etch techniques. As a result, the gate electrode GE made of the conductive films GE1 and GE2 are formed.

A sidewall insulating film SW having a sidewall shape is formed on the sidewall of the gate electrode GE. Thereafter, an n-type impurity and a p-type impurity are implanted into the first surface FS of the semiconductor substrate SUB by ion implantation or the like. As a result, the p+ source region SC, the p+ drain region DC, and the n+ contact region WC are formed on the first surface FS of the semiconductor substrate SUB. The p+ source region SC is formed so as to constitute a p-n junction with the n-type body region NWL.

The p⁺ drain region DC is formed so as to sandwich the element isolation insulating film SIS with the p⁺ source region SC.

Figure 15:
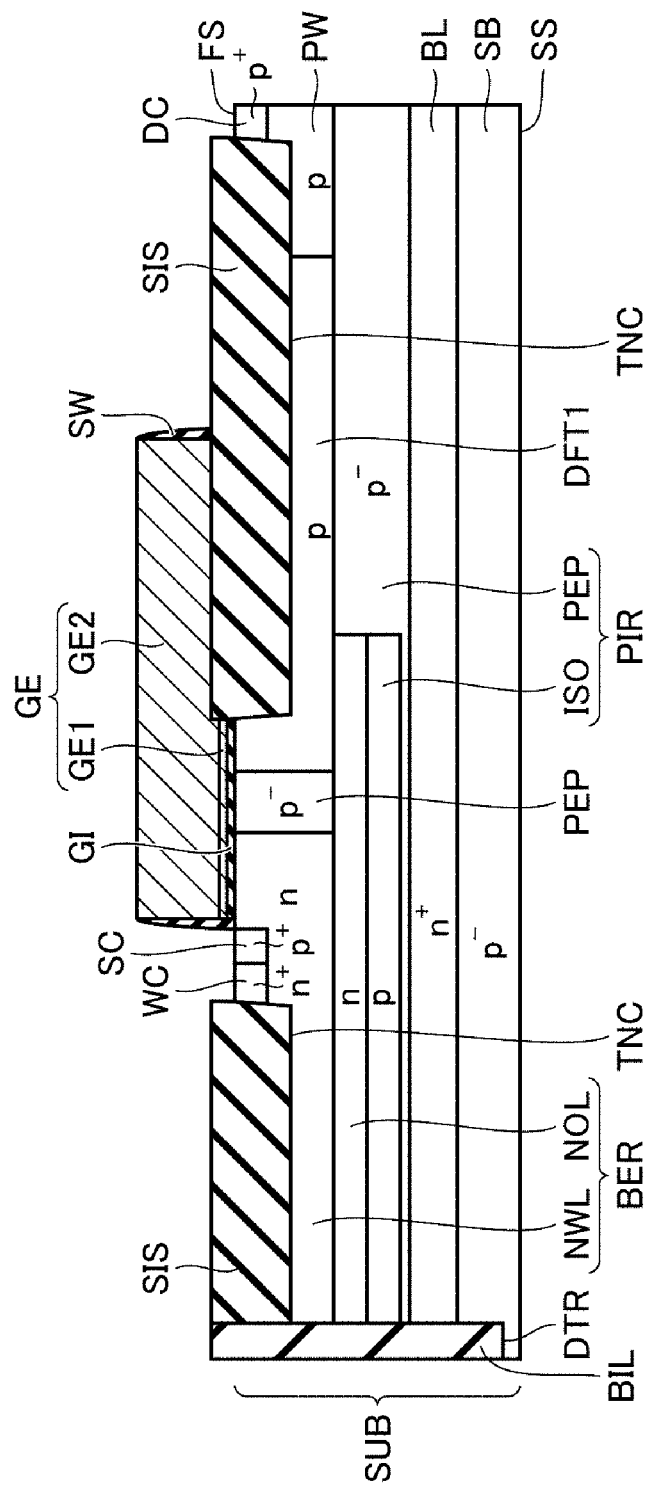
FIG. 15 is a schematic cross-sectional view showing a ninth step of the manufacturing method of the semiconductor device in the first embodiment.

As shown in FIG. 15, a trench DTR is formed so as to reach the p⁻ substrate region SB from the upper surface of the element isolation insulating film SIS. The trench DTR is formed to extend from the first surface FS toward the second surface SS. An insulating film BIL made of, for example, a silicon oxide film is formed so as to fill the trench DTR. As a result, a DTI (Deep Trench Isolation) composed of the trench DTR and the insulating film BIL is formed.

At the end of the n-type body extension region BER closer to the p⁺ drain region DC, the first portion FP of the n-type body extension region BER is located closest to the second surface SS. And at the end of the n-type body extension region BER closer to the p⁺ drain region DC, the second portion SP of the n-type body extension region BER is located on the first surface FS. The n-type body extension region BER is formed so that the first portion FP is located closer to the p⁺ drain region DC than the second portion SP, and is located closer to the second surface SS than the bottom surface BS of the element isolation insulating film SIS.

As shown in FIG. 2 and FIG. 3, the interlayer insulating film IS, the plug conductive layer PL, the wiring layer INC, and the like are formed, whereby a semiconductor device of a present embodiment is manufactured.

Configuration of BiC-DMOS

Next, a configuration of BiC-DMOS having the pLDMOS transistor LPT will be described with reference to FIG. 16.

Figure 16:
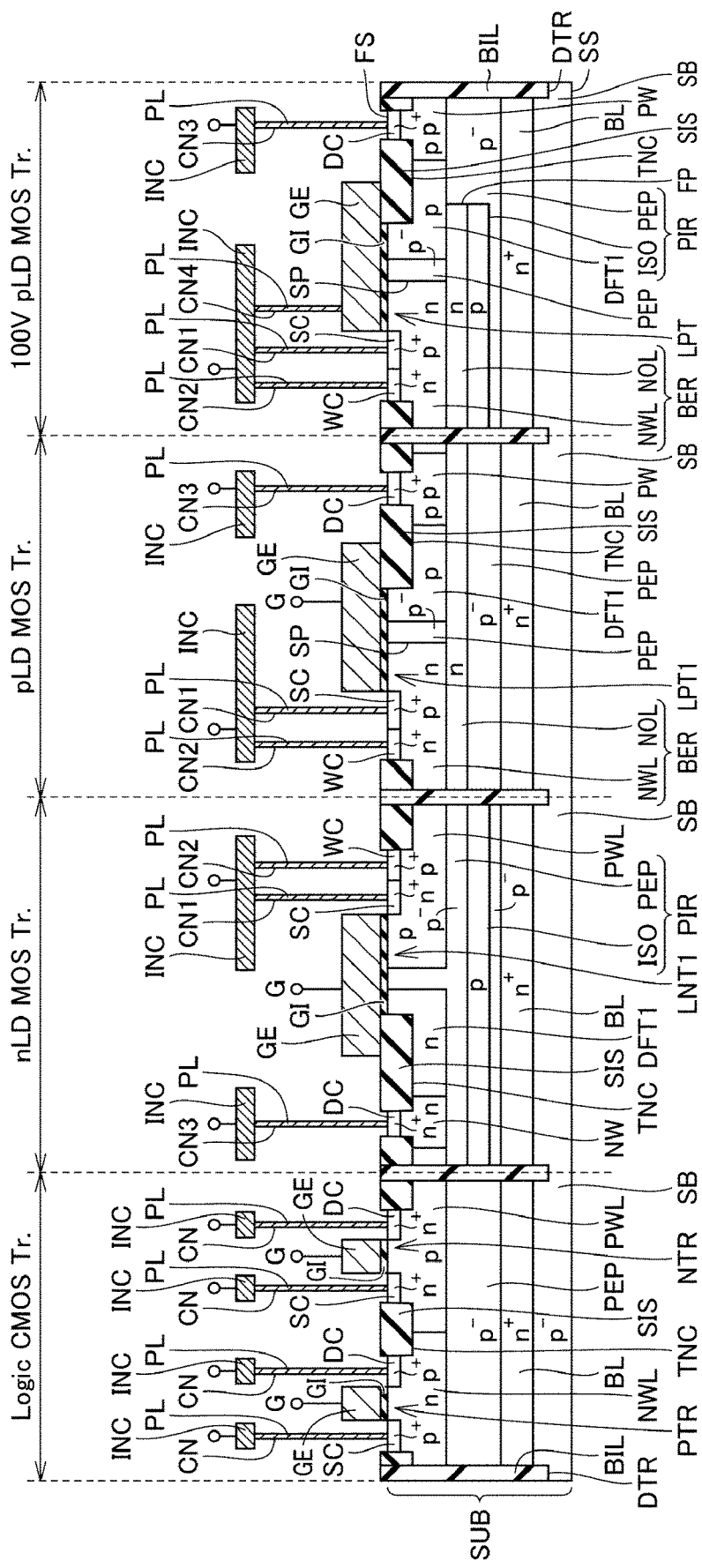
FIG. 16 is a cross-sectional view showing a configuration in which the pLDMOS transistor having a breakdown voltage of 100V in the first embodiment is combined with the pLDMOS transistor, a nLDMOS transistor, and a CMOS transistor.

As shown in FIG. 16, BiC-DMOS includes, in addition to the pLDMOS transistor LPT, a pLDMOS transistor LPT1, a nLDMOS transistor LNT1, and logic CMOS transistors NTR and PTR. In BiC-DMOS, the pLDMOS transistor LPT is used as an element having a breakdown voltage of, for example, 100 V. The logic CMOS transistor has a nMOS transistor NTR and a pMOS transistor PTR.

Each transistor is formed on the first surface FS of the semiconductor substrate SUB. A formation region of each transistor is electrically isolated by DTI (Deep Trench Isolation). The DTI has the trench DTR formed in the first surface FS of the semiconductor substrate SUB and the insulating film BIL filling in the trench DTR.

The pLDMOS transistor LPT1 differs from the pLDMOS transistor LPT in that the n-type extension region NOL is distributed at different position and the p-type punch-through prevention layer ISO is omitted.

In the pLDMOS transistor LPT1, the n-type extension region NOL is disposed over an entire region of the formation region of the pLDMOS transistor LPT in plan view. The n-type extension region NOL constitutes a p-n junction with the p⁻ epitaxial region PEP.

Since the configuration of the pLDMOS transistor LPT1 other than the above is substantially the same as the configuration of the pLDMOS transistor LPT, the same elements as those of the pLDMOS transistor LPT are denoted by the same reference numerals, and descriptions thereof will not be repeated.

The nLDMOS transistor LNT1 has substantially the same structure as the structure in which the respective regions constituting the pLDMOS transistor LPT1 are changed to the opposite conductivity type. In the formation region of the nLDMOS transistor LNT1, the p⁻ substrate region SB is disposed on the second surface SS of the semiconductor substrate SUB. On the first surface FS of the p⁻ substrate region SB, the n⁺ buried region BL and the p⁻ epitaxial region PEP are disposed. In the p⁻ epitaxial region PEP, p-type punch-through prevention layer ISO having a higher p-type impurity density than the p⁻ epitaxial region PEP is disposed.

In the formation region of the logic CMOS transistor, the p⁻ substrate region SB is disposed on the second surface SS of the semiconductor substrate SUB. In a first surface FS side of the p⁻ substrate region SB, the n⁺ buried region BL and the p⁻ epitaxial region PEP are disposed. In the first surface FS side of the p⁻ epitaxial region PEP, the p-type well region PWL and the n-type body region NWL are disposed. In the p-type well region PWL, the nMOS transistor NTR is disposed. In the n-type body region NWL, the pMOS transistor PTR is disposed.

The formation region of the nMOS transistor NTR and the formation region of the pMOS transistor PTR are electrically isolated from each other by STI. The isolation trench TNC of the STI is disposed shallower than the trench DTR of the DTI from the first surface FS. The isolation trench TNC of the STI is disposed shallower than the p-type well region PWL and the n-type body region NWL.

The nMOS transistor NTR has the p⁺ source region SC, the p⁺ drain region DC, the gate dielectric film GI, and the gate electrode GE. The p⁺ source region SC and the p⁺ drain region DC are disposed on the first surface FS in the p-type well region PWL with a space therebetween. The gate electrode GE is disposed on the first surface FS sandwiched between the p⁺ source region SC and the p⁺ drain region DC with the gate dielectric film GI interposed therebetween.

The pMOS transistor PTR has the p⁺ source region SC, the p⁺ drain region DC, the gate dielectric film GI, and the gate electrode GE. The p⁺ source region SC and the p⁺ drain region DC are disposed on the first surface FS in the n-type body region NWL with a space therebetween. The gate electrode GE is disposed on the first surface FS sandwiched between the p⁺ source region SC and the p⁺ drain region DC with the gate dielectric film GI interposed therebetween.

The n-type extension region NOL of the pLDMOS transistor LPT may be formed by ion implantation at the same time as the n-type extension region NOL of the pLDMOS transistor LPT1. The p-type punch-through prevention layer ISO of the pLDMOS transistor LPT may be formed by ion implantation at the same time as the p-type punch-through prevention layer ISO of the nLDMOS transistor LNT1.

Next, effect of the present embodiment will be described together with a study performed by the inventor.

In the bulk BiC-DMOS process, an upper limit of a breakdown voltage of an LDMOS transistor is often about 70-80V. However, with the recent acceleration of electronization of cars, the breakdown voltage is required to be higher than the above. For example, in a battery monitoring application for automotive, more series connected battery cells can be monitored at once by using higher breakdown voltage LDMOS transistors. Therefore, a number of components in an integrated circuit can be reduced. In such a situation, a breakdown voltage of 100-120V class is required recently.

In the pLDMOS transistor of the bulk BiC-DMOS process up to the 80V class, the n⁺ buried region BL may be disposed below a transistor BL. RESURF (REduced SURface Field) effect obtained from the n⁺ buried region is effectively used for improving the breakdown voltage. However, since the n⁺ buried region BL is provided, an epitaxial layer is as thin as about several μm. Therefore, it is difficult to add a 100 V class LDMOS transistor in this condition because it is limited by the breakdown voltage in vertical direction.

As countermeasures against this, it is considered to (1) increase the thickness of the epitaxial layer, (2) remove the $n^+$ buried region BL, (3) use an SOI (Silicon On Insulator) substrate, and the like. However, the above mentioned (1) and (2) will weaken RESURF effect of the other low-voltage LDMOS and will degrade its performance. In the above (2), the punch-through breakdown voltage between the drain and the substrate cannot be ensured. Therefore, the above (2) is limited to applications in which the potential difference between the drain and the substrate is small, such as setting the drain to the same potential as the substrate. Further, in the above (3), there is a problem of increase a substrate cost, at the same time, and there is a need to redesign a device structures of other low-voltage LDMOS transistors, which leads to an increase in the time cost.

In view of the above, the inventor has reached a configuration of the present embodiment shown in FIG. 3 and studied the effects of the configuration.

First, the inventor examined a suppressing effect of an impact ionization by device-simulation for each of a structure of a comparative example in which the n-type extension region NOL is removed from the structure of FIG. 3 and a structure of the present embodiment shown in FIG. 3. Results are shown in FIGS. 17 and 18.

Figure 17:
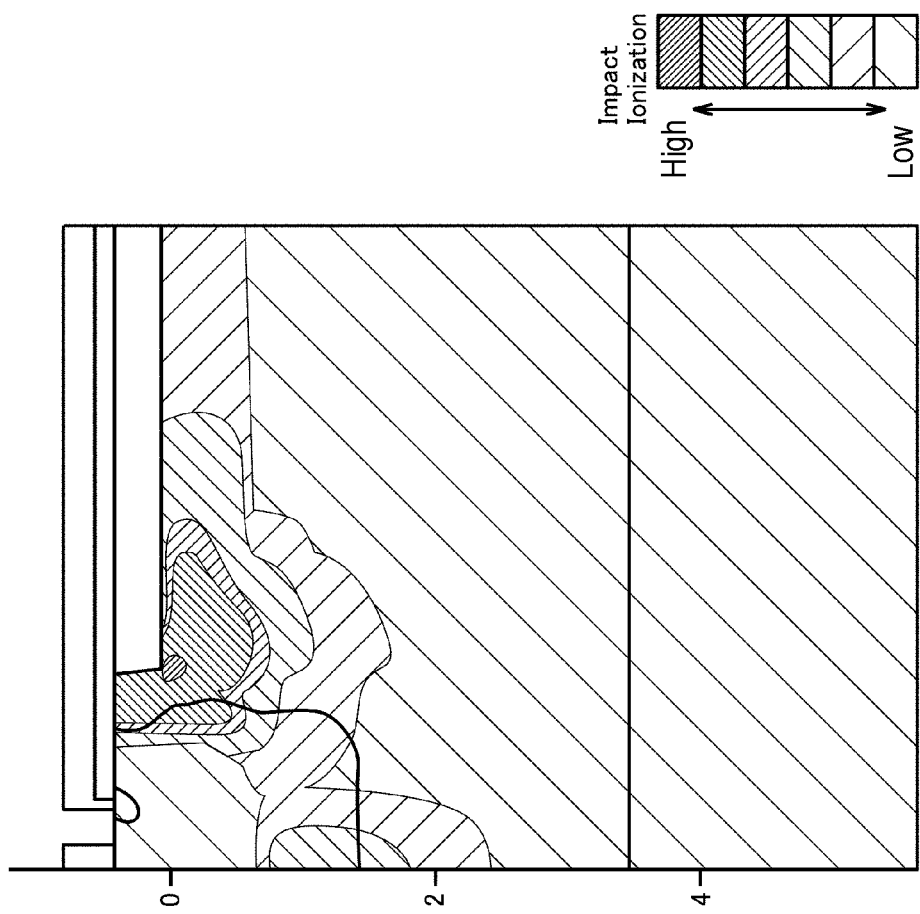
FIG. 17 is a diagram showing impact ionization rate distributions in a configuration of a comparative example.
Figure 18:
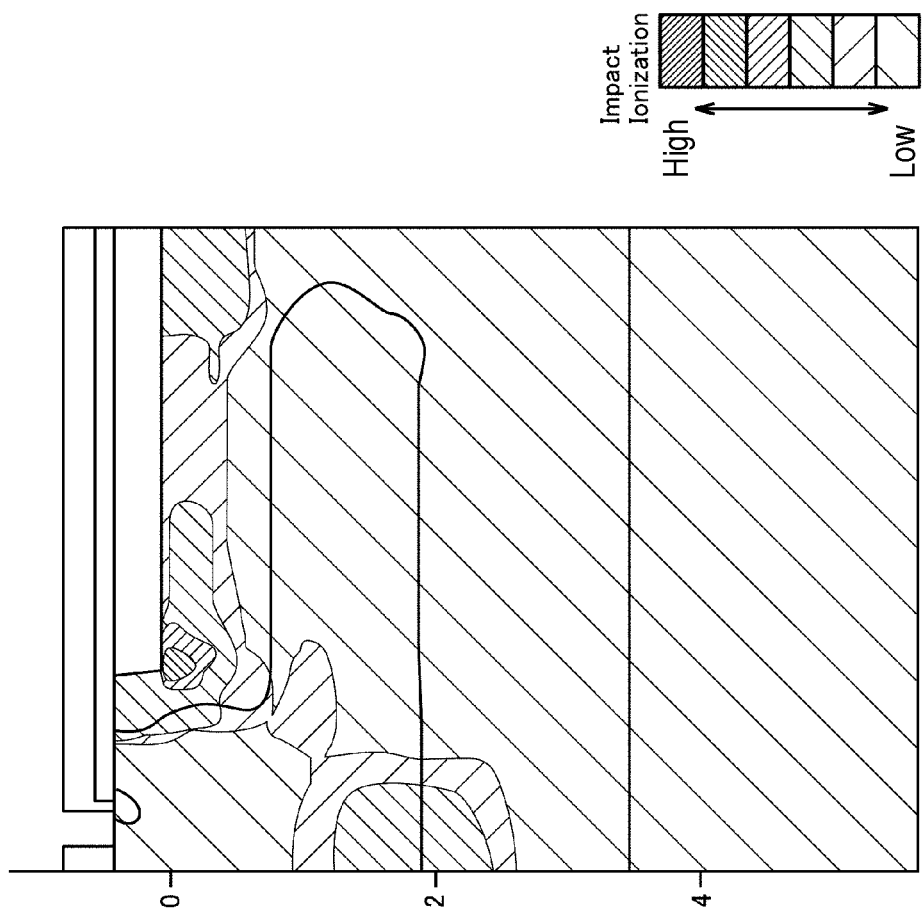
FIG. 18 is a diagram showing impact ionization rate distributions in a configuration of the first embodiment.

FIG. 17 shows an impact ionization rate distribution of semiconductor device in the comparative example, and FIG. 18 shows an impact ionization rate distribution of semiconductor device in the present embodiment. From these results, it can be seen that the comparative example, as shown in FIG. 17, the impact ionization rate is high at a lower end on a source region side of the STI. On the other hand, in the present embodiment, as shown in FIG. 18, it can be seen that the impact ionization rate is lower at the lower end of the source region side of the STI than in the comparative example.

In addition, the inventor examined the dependency of a stress time of the gate current in each of the comparative example and the present embodiment described above. The result is shown in FIG. 19.

Figure 19:
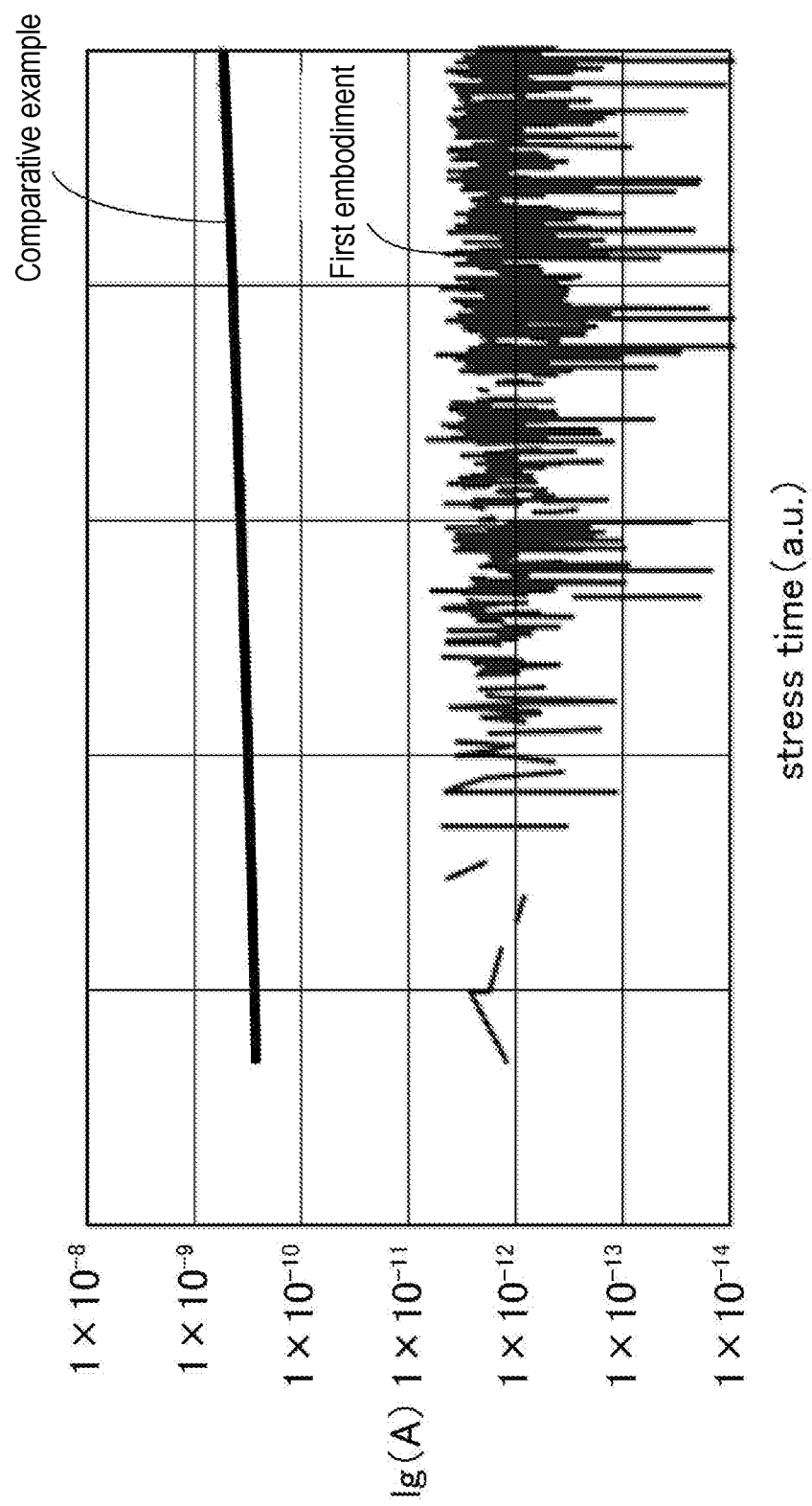
FIG. 19 is a graph showing a stress-time dependence of a gate current Ig in each of a structure of the comparative examples and a structure of the first embodiment.

From the result of FIG. 19, it can be seen that a gate current Ig in the present embodiment decreases by about two orders of magnitude with respect to a gate current Ig in the comparative example.

Here, the gate current Ig is a current flowing between the semiconductor substrate SUB and the gate electrode GE via the gate dielectric film GI or the like. For this reason, "small gate current Ig" means that amount of carriers injected from the semiconductor substrate SUB into the gate electrode GE is small. Therefore, from the above result that the gate current Ig is reduced, it can be seen that hot carriers can be suppressed from being injected into the gate electrode GE in present embodiment compared to the comparative example.

Figure 20:
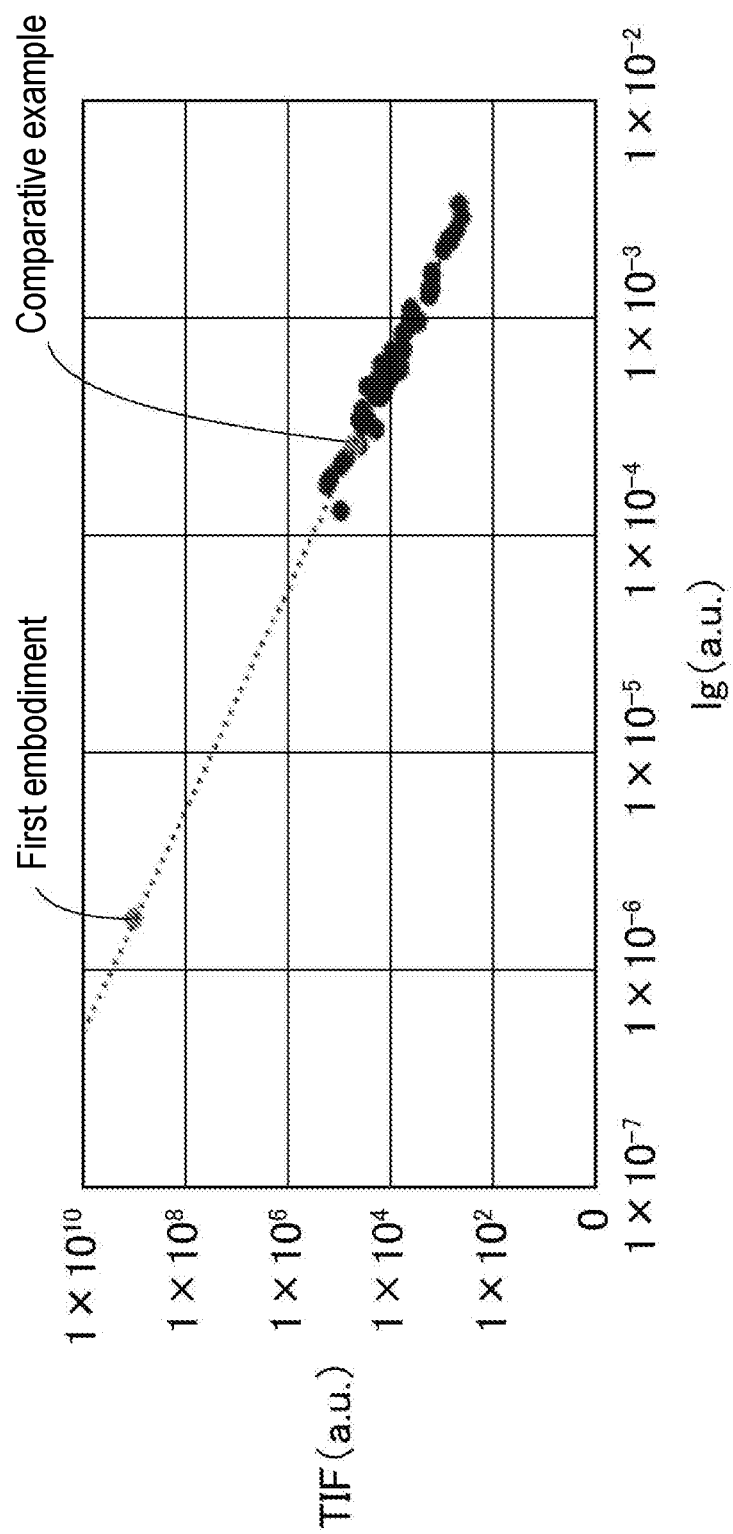
FIG. 20 is a graph showing correlations between the gate current Ig and a time-to-failure (TTF) in each of the structure of the comparative examples and the structure of the first embodiment.

As shown by a broken line in FIG. 20, the gate current Ig correlates with the lifetime (TTF: Time To Failure) due to HCI, and the HCI lifetime is improved by decreasing the gate current Ig. From these results, it is found that in the present embodiment, as a result of suppressing the injection of the hot carriers into the gate electrodes GE due to the decrease in the ionization rate as compared with the comparative example, the gate current Ig is decreased and the HCI lifetime is greatly improved.

In present embodiment, as shown in FIG. 3, the first portion FP of the n-type body extension region BER is located closer to the $p^+$ drain region DC than the second portion SP of the n-type body extension region BER. The first portion FP of the n-type body extension region BER is located closer to the second surface SS than the bottom surface BS of the element isolation insulating film SIS. As a result, a depletion layer extends from the n-type body extension region BER into the p-type drift region DFT1 toward the first surface FS. As a result, RESURF effect is obtained, and an electric field in the X-direction is easily equalized. Therefore, the ionization rate is reduced, the implantation of hot carriers into the gate dielectric film GI is suppressed, the gate current Ig is reduced, and the HCI lifetime is greatly improved.

In the present embodiment, the n-type body extension region BER is electrically isolated from the $n^+$ buried region BL by the p-type impurity region PIR. Therefore, it is possible to increase the breakdown voltage in the depth direction between the n-type body extension region BER and the $n^+$ buried region BL.

In the present embodiment, as shown in FIG. 3, the n-type body extension region BER has the n-type body region NWL and the n-type extension region NOL. The n-type extension region NOL protrudes from the n-type body region NWL to the $p^+$ drain region DC side and is in contact with a portion of the p-type drift region DFT1 on the second surface SS side. As a result, the depletion layer can be widened from the p-n junction between the n-type extension region NOL and the p-type drift region DFT1 toward the first surface FS, and RESURF effect can be obtained.

In the present embodiment, as shown in FIG. 3, the n-type extension region NOL extends from the n-type body region NWL to the second surface SS of the element isolation insulating film SIS. Therefore, the electric field is easily equalized by RESURF effect even at the end of the element isolation insulating film SIS closer to the SC side of the $p^+$ source region SC side. As a result, the ionization rate is further reduced, the implantation of hot carriers into the gate dielectric film GI is further suppressed, the gate current Ig is reduced, and the HCI lifetime is greatly improved.

In FIG. 3, the n-type extension region NOL may extend closer to the $p^+$ drain region DC than an end portion EP of the gate electrode GE. In such case, the n-type body extension region BER and the $n^+$ buried region BL are easily electrically connected to each other through the n-type extension region NOL. Therefore, the breakdown voltage between the n-type body extension region BER and the $n^+$ buried region BL in the depth direction may be lowered.

On the other hand, in the present embodiment, as shown in FIG. 3, an end portion FP of the n-type extension region NOL on the side of the $p^+$ drain region DC is located closer to the $p^+$ source region SC than the end portion EP of the gate electrode GE on the side of the $p^+$ drain region DC. Therefore, it possible to maintain a high breakdown voltage in the depth direction between the n-type body extension region BER and the $n^+$ buried region BL.

In the present embodiment, as shown in FIG. 3, the p-type impurity region PIR has the $p^-$ epitaxial region PEP and the p-type punch-through prevention layer ISO. The p-type punch-through prevention layer ISO has a higher p-type impurity density than the $p^-$ epitaxial region PEP, and the p-type punch-through prevention layer ISO is disposed between the n-type body extension region BER and the $n^+$ buried region BL. Since the p-type punch-through prevention layer ISO is provided, the effect of electrically separating the n-type body extension region BER from the $n^+$ buried region BL can be further improved.

In the present embodiment, as shown in FIG. 3, the p-type punch-through prevention layer ISO is disposed on the second surface SS of the n-type extension region NOL. As a result, the effect of electrically isolating the n-type body extension region BER from the n+ buried region BL can be further improved.

In the present embodiment, as shown in FIG. 2, the p-type punch-through prevention layer ISO extends longer than the p+ drain region DC along the Y-direction in plan view. As a result, a current driving capability of the pLDMOS transistor LPT can be enhanced.

Second Embodiment

Next, a configuration of a semiconductor device in a second embodiment will be described with reference to FIGS. 21A, 21B and 22.

Figure 21:
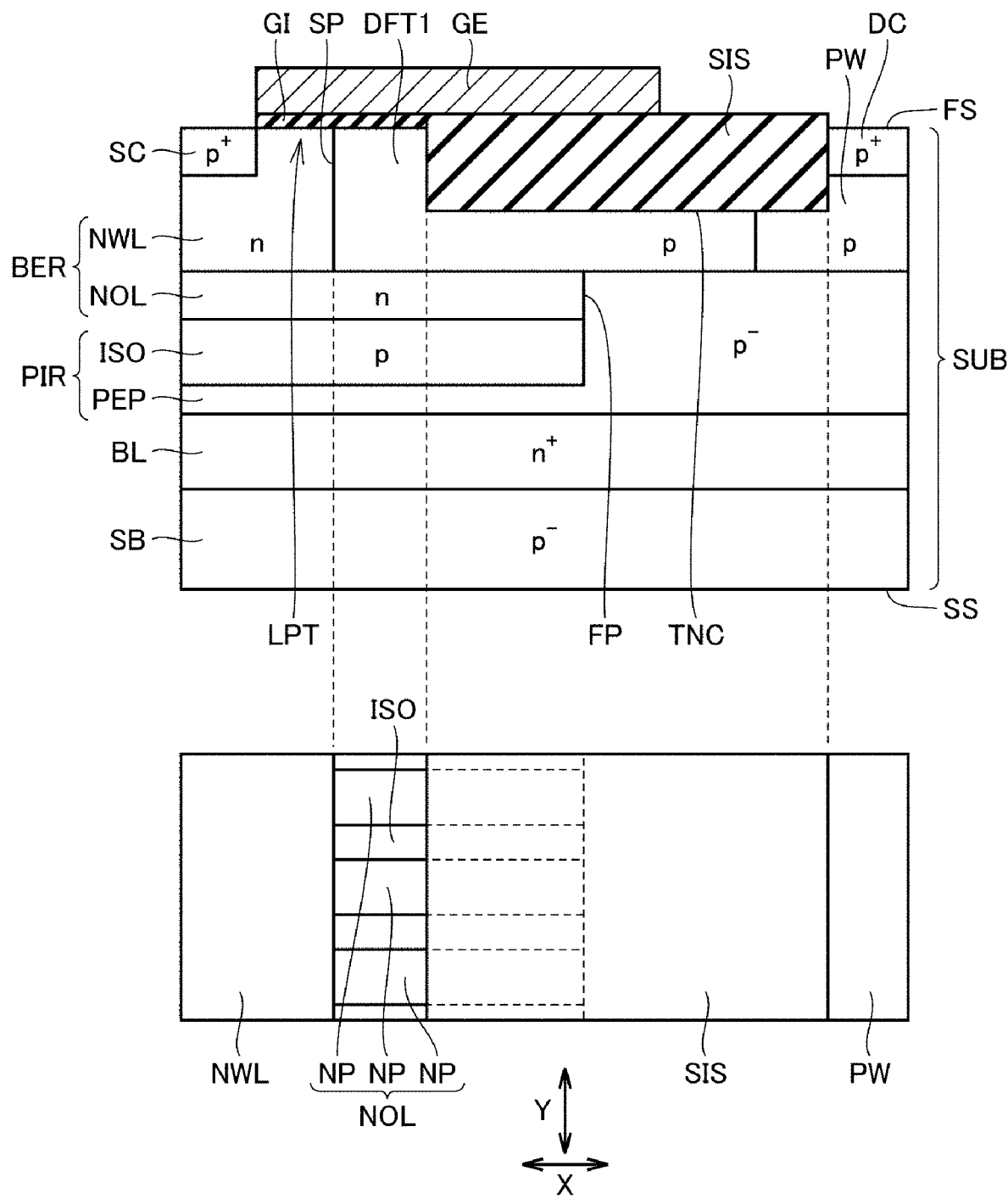
FIG. 21 is schematic cross-sectional view and plan view showing a configuration of a semiconductor device in a second embodiment.

As shown in FIG. 21, a configuration of the present embodiment is different from the configuration of the first embodiment in a configuration of the n-type extension region NOL.

In the present embodiment, the n-type extension region NOL has a plurality of extended portion NP extending from the p+ drain region DC toward the p+ source region SC. Each of the plurality of extended portion NP is disposed along a direction (Y-direction) intersecting (e.g., perpendicular) a direction (X-direction) from the p+ drain region DC toward the p+ source region SC in the plan view shown in lower side of FIG. 21.

Figure 22:
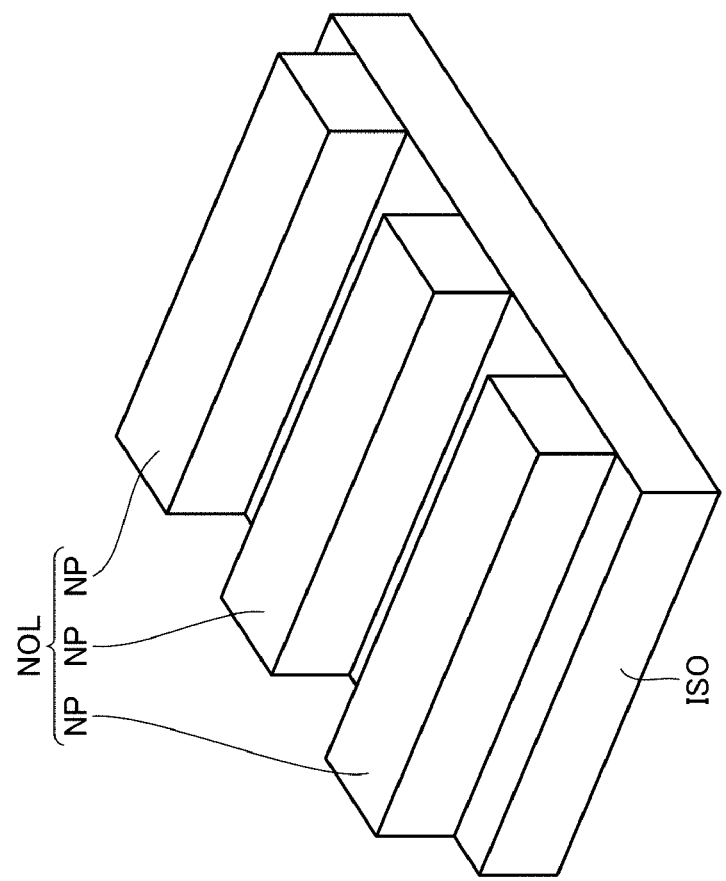
FIG. 22 is an enlarged perspective view showing a configuration of an n-type extension region NOL and a p-type punch-through prevention layer ISO of a p-type impurity region PIR in FIG. 21.

As shown in FIG. 22, one p-type punch-through prevention layer ISO is provided for a plurality of extended portion NP.

Figure 23:
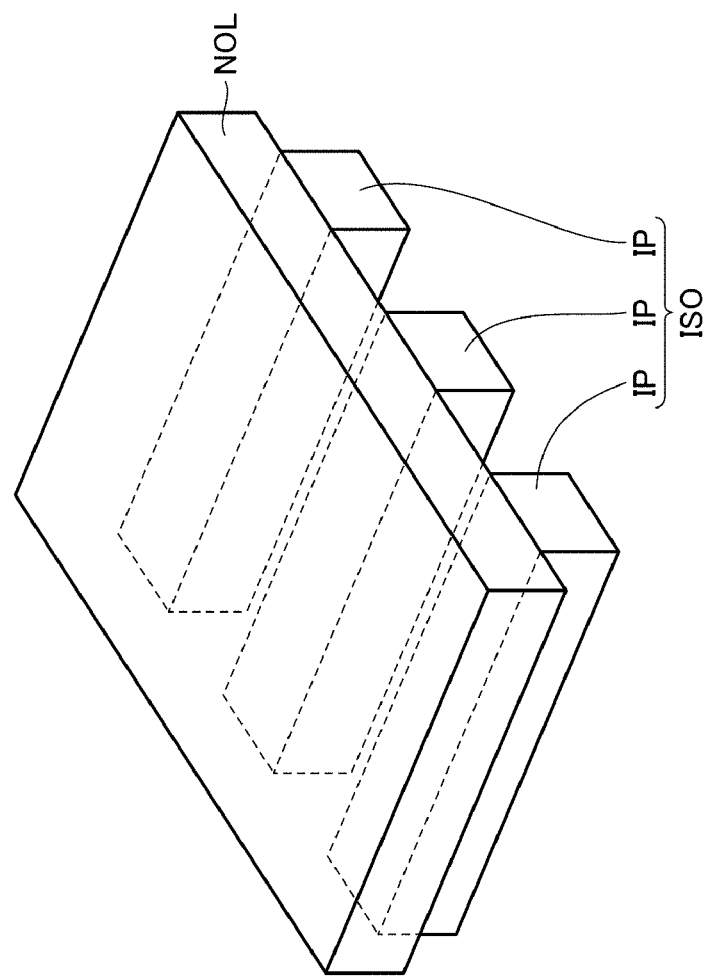
FIG. 23 is a perspective view showing a first modified example of a configuration of the n-type extension region NOL and the p-type punch-through prevention layer ISO of the p-type impurity region PIR.

In the above description, the case where the n-type extension region NOL has a plurality of extended portion NP with respect to one p-type punch-through prevention layer ISO has been described. However, as shown in FIG. 23, the p-type punch-through prevention layer ISO may have a plurality of p-type region IP for one n-type extension region NOL. In this case, each of the plurality of p-type region IP is disposed along the Y-direction in the drawing in plan view.

Figure 24:
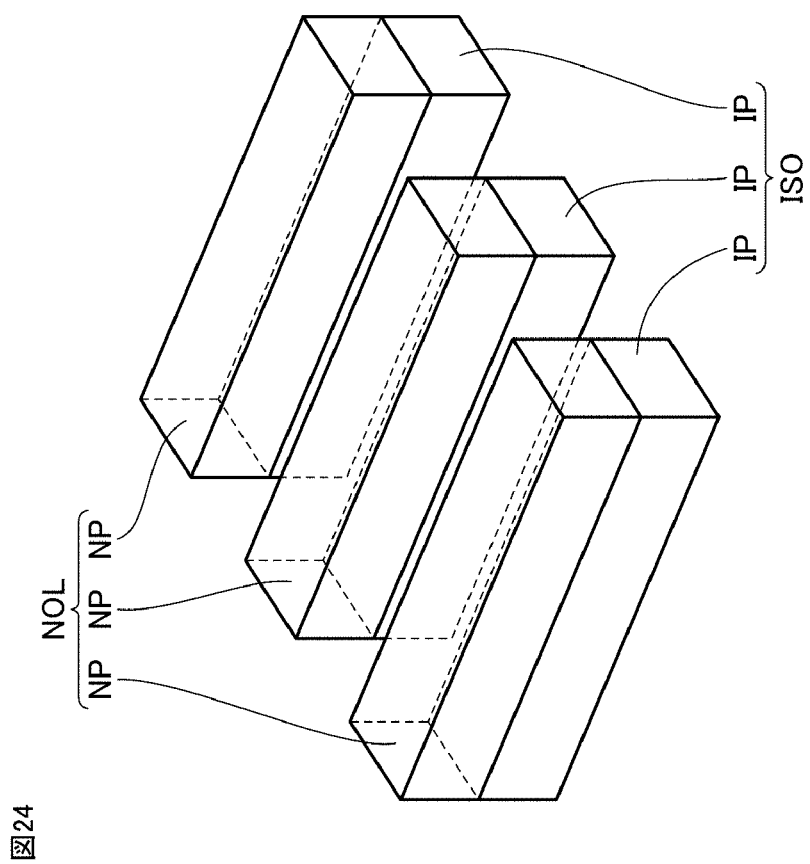
FIG. 24 is a perspective view showing a second modified example of a configuration of the n-type extension region NOL and the p-type punch-through prevention layer ISO of the p-type impurity region PIR.

As shown in FIG. 24, the n-type extension region NOL may have the plurality of extended portion NP, and the p-type punch-through prevention layer ISO may have the plurality of p-type region IP. In this case, each of the plurality of extended portion NP is disposed along the Y-direction in the drawing in plan view. Each of the plurality of p-type region IP is also disposed along the Y-direction in the drawing in plan view. Each of the plurality of extended portion NP is disposed corresponding to each of the plurality of p-type region IP.

As described above, at least one of the n-type extension region NOL and the p-type punch-through prevention layer ISO is separated into a plurality of regions.

Since the configuration of the present embodiment other than the above is substantially the same as the configuration of the first embodiment, the same elements as those of the first embodiment elements are denoted by the same reference numerals as those of the first embodiment, and descriptions thereof will not be repeated.

In the present embodiment, as shown in FIGS. 21B and 22, at least one of the n-type extension region NOL and the p-type punch-through prevention layer ISO is separated into a plurality of regions. Thus, at least one of the effective n-type impurity density in the n-type extension region NOL and the effective p-type impurity density in the p-type punch-through prevention layer ISO can be diluted. Therefore, it is possible to obtain an optimum value of impurity density in at least one of the n-type extension region NOL and the p-type punch-through prevention layer ISO for maximizing RESURF effect.

Figure 25:
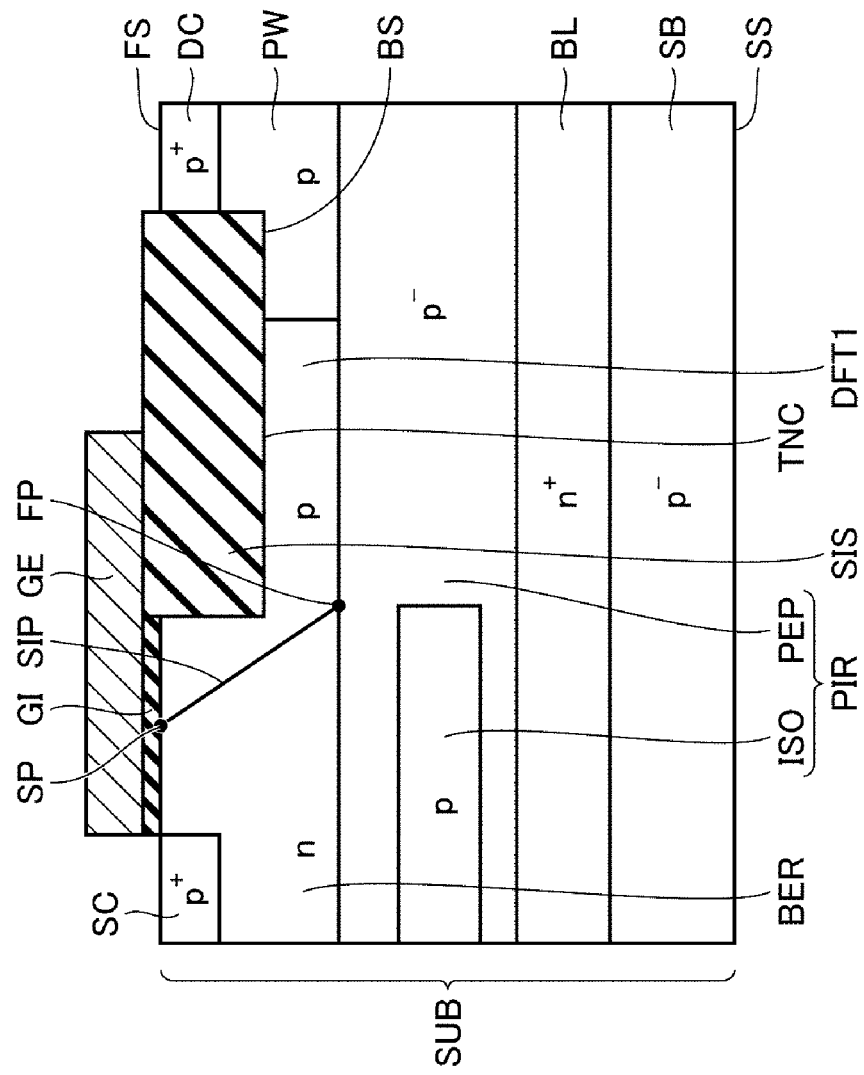
FIG. 25 is a cross-sectional view showing a modified example configuration of an n-type body extension region.

In the above description, a configuration in which the n-type body extension region BER has the n-type body region NWL and the n-type extension region NOL has been described. However, the n-type body extension region BER may be formed of a single impurity region as shown in FIG. 25. The first portion FP located closest to the second surface SS in the n-type body extension region BER composed of the single impurity region may be located closer to the p+ drain region DC than the second portion SP located closer to the first surface FS. The first portion FP may be positioned closer to the second surface SS than the bottom surface BS of the element isolation insulating film SIS.

The first portion FP is preferably located on the second surface SS of the element isolation insulating film SIS.

In this configuration, the side portion of the p+ drain region DC in the n-type body extension region BER is inclined so as to approach the p+ drain region DC from the first surface FS toward the second surface SS. A side portion SIP of the p+ drain region DC in the inclined the n-type body extension region BER constitutes p-n junctions with p-type impurity region, for example, the p-type drift region DFT1.

The p-type punch-through prevention layer ISO may be disposed away from the portion of the n-type body extension region BER on the second surface SS side.

In the first and second embodiments, the configuration of the present disclosure is applied to the pLDMOS transistor LPT, but the configuration of the present disclosure may be applied to the nLDMOS transistor LNT.

Although the invention made by the present inventor has been specifically described based on the embodiment, the present invention is not limited to the embodiment described above, and it is needless to say that various modifications can be made without departing from the gist thereof.

What is claimed is:

1. A semiconductor device provided with an insulated-gate field-effect transistor, comprising:
   a semiconductor substrate having a first surface and a second surface opposing each other;
   a buried region of a first conductivity type, the buried region disposed on the semiconductor substrate in a region where the insulated-gate field-effect transistor is formed and having a floating potential;
   an isolation region of a second conductivity type disposed on the first surface side of the buried region;
   a drift region of the second conductivity type disposed on the first surface side of the isolation region;
   a body extension region of the first conductivity type disposed on the first surface side of the isolation region and separated from the buried region by the isolation region and in contact with the drift region;
   an element isolation insulating film having a bottom surface disposed on the first surface, the bottom surface disposed closer to the second surface than the first surface;
   a source region of the second conductivity type disposed on the first surface and forming a p-n junction with the body extension region;
   a drain region of the second conductivity type disposed on the first surface such that sandwich the element isolation insulating film with the source region,
   wherein in an end potion of the body extension region on the drain region side, a first portion of the body extension region disposed closest to the second surface is disposed closer to the drain region than a second portion of the body extension region disposed on the first surface, and the first portion is disposed closer to the second surface than the bottom surface of the element isolation insulating film.

2. The semiconductor device according to claim 1, wherein the body extension region comprises:
a body region forming the p-n junction with the source region, and
an extension region projecting from the body region toward the drain region and contacting a portion of the drift region on the second surface side.

3. The semiconductor device according to claim 2, wherein the extension region extends from the body region to the second surface of the element isolation insulating film.

4. The semiconductor device according to claim 3, comprising
a gate electrode disposed on a region of the semiconductor substrate sandwiched between the source region and the drain region,
wherein a first end of the extension region on the drain region side is disposed closer to the source region than a second end of the gate electrode on the drain region side.

5. The semiconductor device according to claim 2, wherein the extension region has a plurality of extended portion extending from the drain region toward the source region, and
each of the plurality of extended portion is mutually separated along a direction intersecting a direction from the drain region toward the source region in plan view.

6. The semiconductor device according to claim 1, wherein the isolation region comprises:
an epitaxial region forming a p-n junction with the buried region, and
a high density region having a density of impurities of the second conductivity type higher than that of the epitaxial region and disposed between the buried region and the body extension region.

7. The semiconductor device according to claim 6, wherein the high density region is disposed on the second surface side of the body extension region.

8. The semiconductor device according to claim 6, wherein the high density region extends longer than the drain region along a direction intersecting a direction from the drain region toward the source region in plan view.

9. The semiconductor device according to claim 6, wherein the high density region has a plurality of high density extension portions extending from the drain region toward the source region, and
each of the plurality of high density extension portions is mutually separated along a direction intersecting a direction from the drain region toward the source region in plan view.

10. A method for manufacturing a semiconductor device providing an insulated-gate field-effect transistor, comprising the steps of:
providing a semiconductor substrate having a first surface and a second surface opposing each other and having a buried region of a first conductivity type having a floating potential in a forming region of the insulated-gate field-effect transistor;
forming an isolation region of a second conductivity type on the first surface side of the buried region;
forming a drift region of the second conductivity type on the first surface side of the isolation region;
forming a body extension region of the first conductivity type on the first surface side of the isolation region so as to be separated from the buried region by the isolation region and contact with the drift region;
forming an element isolation insulating film disposed on the first surface and having a bottom surface disposed closer to the second surface than the first surface;
forming a source region of the second conductivity type constituting a p-n junction with the body extension region on the first surface; and
forming a drain region of the second conductivity type sandwiching the element isolation insulating film between the source region and the source region,
wherein in an end potion of the body extension region on the drain region side, a first portion of the body extension region disposed closest to the second surface is disposed closer to the drain region than a second portion of the body extension region disposed on the first surface, and
the first portion is disposed closer to the second surface than the bottom surface of the element isolation insulating film.

* * * * *